United States Patent [19]
Ishida et al.

[11] Patent Number: 5,751,191
[45] Date of Patent: May 12, 1998

[54] REPRODUCING SIGNAL AMPLIFIER AND CENTRAL VALUE SIGNAL GENERATOR

[75] Inventors: Kenichi Ishida; Michinori Kishimoto; Takashi Yamamoto; Koji Sushihara, all of Fukuoka, Japan

[73] Assignee: Matsushita Electric Industrial Co., Ltd., Osaka, Japan

[21] Appl. No.: 708,064

[22] Filed: Aug. 12, 1996

[30] Foreign Application Priority Data

Feb. 1, 1996 [JP] Japan .................... 8-016325

[51] Int. Cl.⁶ ............................ H03F 3/68; G11B 5/02
[52] U.S. Cl. ............................ 330/125; 360/68
[58] Field of Search ............ 327/60, 62; 330/125, 330/69; 360/67, 68

[56] References Cited

U.S. PATENT DOCUMENTS 5,051,847  9/1991  Philipps ........................ 360/46
5,386,109  1/1995  Ikeuchi et al. ............... 327/514 X

FOREIGN PATENT DOCUMENTS 3-063967  3/1991  Japan .

*Primary Examiner*—Steven Mottola
*Attorney, Agent, or Firm*—McDermott, Will & Emery

[57] ABSTRACT

A magnetic recording device includes a magnetic disk drive for recording desired information as a magnetic signal and a reproducing signal amplifier for amplifying a small electric signal obtained by converting the magnetic signal. The reproducing signal amplifier includes an amplifier for amplifying a small electric signal supplied through an input terminal into an amplified signal having an appropriate amplitude, a central value detection circuit for detecting a central value of the AC component of the amplified signal output by the amplifier and outputting a central value signal consisting of the DC component of the amplified signal, and a subtracter for obtaining a difference between the amplified signal and the central value signal and outputting a reproducing signal.

16 Claims, 16 Drawing Sheets

1

REPRODUCING SIGNAL AMPLIFIER AND CENTRAL VALUE SIGNAL GENERATOR

BACKGROUND OF THE INVENTION

The present invention relates to a reproducing signal amplifier for amplifying a small signal, and more particularly, it relates to a reproducing signal amplifier used for amplifying a small signal in a magnetic recording device.

A reproducing signal amplifier used in a conventional magnetic recording device will now be described referring to FIG. 19.

FIG. 19 is a diagram for showing the configuration of the reproducing signal amplifier in the conventional magnetic recording device. As is shown in FIG. 19, the magnetic recording device 101 includes a magnetic disk drive 102 for recording desired information as a magnetic signal and a reproducing signal amplifier 103 for amplifying a small electric signal obtained by converting the magnetic signal.

The magnetic disk drive 102 includes a plurality of magnetic media 104 on which the information is recorded as the magnetic signal and a plurality of reproducing heads 105 such as a thin-film induction type head and a magneto-resistance effect (MR) head for converting the magnetic signal recorded on each magnetic medium 104 into the electric signal, that is, small variation of a voltage or current.

The reproducing signal amplifier 103 includes an amplifier 106 for amplifying a supplied small electric signal read by one of the reproducing heads 105 of the magnetic disk drive 102 into an amplified signal having an amplitude appropriate for processing.

The reproducing signal which has been amplified by the amplifier 106 is input to a signal processor (not shown) in a subsequent stage, so as to reproduce the information recorded as the variation of the magnetic signal.

As a method of increasing the recording capacity of the magnetic recording device 101, the magnetic recording density of each magnetic medium 104 is increased.

In the reproducing signal amplifier 103 of the conventional magnetic recording device 101, however, when the magnetic recording density of each magnetic medium 104 is increased, the magnetic energy per information is decreased. Therefore, the electric signal obtained through the conversion by each reproducing head 105 is correspondingly minimized. As a result, when a noise is caused in the electric signal, the amplitude of the noise is relatively larger than the amplitude of the reproducing signal even if the amplitudes are at the same level. When an abruptly changing noise with a large amplitude as compared with a normal input signal is applied to the input signal, a DC component (i.e., a bias signal component) of the input signal is largely varied. This results in a problem that the magnetic signal of the originally recorded information cannot be accurately reproduced.

SUMMARY OF THE INVENTION

The present invention was devised to overcome the aforementioned problems, and the object is reproducing recorded information without errors even when an abruptly changing noise with a large amplitude is applied to an input signal.

In order to attain the object, according to this invention, a central value generator for detecting the central value of an amplified signal output by an amplifier so as to output a central value signal is provided, thereby obtaining a difference between the amplified signal and the central value signal.

The reproducing signal amplifier of this invention comprises an amplifier for amplifying an input signal and outputting an amplified signal; a central value signal generator for receiving the amplified signal, and generating and outputting a central value signal corresponding to a central value of the amplified signal by smoothing an AC component of the amplified signal; and a subtracter for receiving the amplified signal and the central value signal and outputting a reproducing signal obtained as a difference between the amplified signal and the central value signal.

According to the aforementioned configuration, the central value signal is substantially equal to the DC component of the amplified signal because the AC component of the amplified signal is smoothed. Accordingly, since the subtracter obtains a difference between the amplified signal and the central value signal substantially equal to the DC component of the amplified signal, an abruptly changing noise with a large amplitude as compared with a normal amplified signal, which is applied to the amplified signal, is removed from the reproducing signal output by the subtracter. As a result, a reproducing signal including few reproduction errors can be obtained.

The reproducing signal amplifier preferably further comprises a delay circuit for receiving the amplified signal and delaying a phase of the amplified signal so as to be supplied to the subtracter. Thus, the phase of the amplified signal input to the subtracter can accord with the phase of the central value signal, and hence, the reproducing signal output by the subtracter attains higher fidelity to the input signal.

The reproducing signal amplifier preferably further comprises on/off control means for instructing start/halt of an operation of the central value signal generator. Thus, the central value signal generator can be operated as occasion demands. Therefore, the reproducing signal amplifier is applicable to the case where the amplified signal output by the amplifier is desired to be obtained as the reproducing signal.

The reproducing signal amplifier preferably further comprises gain control means for increasing/decreasing a gain of the amplifier. Thus, the gain of the amplifier can be adjusted at an appropriate value in need. Therefore, for example, an abruptly changing noise with a large amplitude, which tends to be caused in switching the operation modes such as the recording mode and the reproducing mode, can be previously suppressed.

The reproducing signal amplifier preferably further comprises a peak value detection circuit for receiving the amplified signal, detecting a peak value of an amplitude of the amplified signal and outputting the peak value to the central value signal generator. Thus, even when the signal level of the bias component of the amplified signal is changed, the central value signal generator can deal with the change of the signal level of the amplified signal. Therefore, the central value signal can be definitely obtained from the amplified signal.

The reproducing signal amplifier preferably further comprises a storage circuit for storing the peak value detected by the peak value detection circuit. Thus, the peak value of the changed signal level can be stored. Therefore, when the power supply for the device is turned off or the operation mode is changed, there is no need of adjustment for coping with the changed signal level of the bias component.

The reproducing signal amplifier preferably further comprises peak value control means for referring/changing the peak value stored in the storage circuit. Thus, the peak value can be read or rewritten to a desired value if necessary. Therefore, the central value signal generated from the amplified signal can be more accurate.

In the reproducing signal amplifier, the central value signal generator preferably includes a voltage generation circuit for generating and outputting a voltage substantially equal to a potential of the amplified signal; and a capacitor which is charged/discharged by the voltage output by the voltage generation circuit so as to smooth the AC component of the amplified signal. Thus, even when an abruptly changing noise with a large amplitude is applied to the input signal, the DC alone can be definitely obtained because the central value signal generator includes the voltage generation circuit which can follow the change of the amplitude and the capacitor consisting of a low-pass filter. As a result, it is possible to obtain a reproducing signal including few reproduction errors.

In the reproducing signal amplifier, the central value signal generator preferably further includes a threshold value detection circuit for detecting a threshold value set in the amplified signal input to the central value signal generator and outputting a threshold value exceeding signal component which exceeds the threshold value set in the amplified signal; and a charge/discharge circuit for charging/discharging the capacitor in accordance with the threshold value exceeding signal component. Thus, when a signal with a large amplitude exceeding the previously set threshold value is input, the capacitor can be rapidly charged or discharged. As a result, the AC component of the amplified signal can be definitely smoothed.

In the reproducing signal amplifier, the threshold value is preferably provided with a hysteresis characteristic by a hysteresis characteristic generation circuit. Thus, the threshold value is provided with the hysteresis characteristic. Therefore, the charge/discharge circuit can be stably operated even in dealing with, for example, an amplified signal whose AC component becomes smaller than the previously set threshold value immediately after exceeding the threshold value. As a result, the AC component of the amplified signal can be more definitely smoothed.

In the reproducing signal amplifier, the central value signal generator preferably further includes a positive threshold value detection circuit for detecting a positive threshold value set in a positive signal component of the amplified signal input to the central value signal generator and outputting a positive threshold value exceeding signal component which exceeds the positive threshold value set in the positive signal component; a negative threshold value detection circuit for detecting a negative threshold value set in a negative signal component of the amplified signal and outputting a negative threshold value exceeding signal component which exceeds, in its absolute value, the negative threshold value set in the negative signal component; a charge circuit for charging the capacitor in accordance with the positive threshold value exceeding signal component; and a discharge circuit for discharging the capacitor in accordance with the negative threshold value exceeding signal component, and the positive threshold value and the negative threshold value are preferably independently set.

Thus, the positive and the negative threshold values can be independently set in the AC component of the amplified signal in consideration of the characteristic of the amplified signal. Therefore, the AC component of the amplified signal can be more definitely smoothed.

In the reproducing signal amplifier, the positive threshold value detection circuit is preferably plural in number, the plural positive threshold value detection circuits preferably have respectively different positive threshold values, and the charge circuit is preferably plural in number so as to respectively correspond to the plural positive threshold value detection circuits. Thus, every time the amplitude in the positive direction of the AC component of the amplified signal successively reaches each of the plural positive threshold values in the order of a smaller amplitude to a larger amplitude in the positive direction, the capacitor is charged by the charge circuit corresponding to that positive threshold value. Therefore, the capacitor is rapidly charged every time the amplitude reaches one of the positive threshold values in a stepwise manner. As a result, the positive AC component of the amplified signal can be more definitely smoothed.

In the reproducing signal amplifier, the negative threshold value detection circuit is preferably plural in number, the plural negative threshold value detection circuits preferably have respectively different negative threshold values, and the discharge circuit is preferably plural in number so as to respectively correspond to the plural negative threshold value detection circuits. Thus, every time the amplitude in the negative direction of the AC component of the amplified signal successively reaches each of the plural negative threshold values in the order of a smaller amplitude to a larger amplitude in the negative direction, the capacitor is discharged by the discharge circuit corresponding to that negative threshold value. Therefore, the capacitor is rapidly discharged every time the amplitude reaches one of the negative threshold values in a stepwise manner. As a result, the negative AC component of the amplified signal can be more definitely smoothed.

In the reproducing signal amplifier, the positive threshold value is preferably provided with a hysteresis characteristic by a positive hysteresis generation circuit, and the negative threshold value is preferably provided with a hysteresis characteristic by a negative hysteresis generation circuit. Thus, the positive and negative threshold values are respectively provided with the hysteresis characteristics. Therefore, the charge or discharge circuit can be stably operated even in dealing with the AC component of an amplified signal whose amplitude becomes smaller than the positive or negative threshold value immediately after exceeding the threshold value. As a result, the AC component of the amplified signal can be more definitely smoothed.

Alternatively, the reproducing signal amplifier of this invention comprises an amplifier for amplifying an input signal and outputting an amplified signal; a central value signal generator for receiving the amplified signal, and generating and outputting a central value signal corresponding to a central value of the amplified signal by smoothing an AC component of the amplified signal; an amplified signal output terminal for outputting the amplified signal output by the amplifier; and a central value signal output terminal for outputting the central value signal output by the central value signal generator.

According to the aforementioned configuration, the amplified signal or the central value signal can be used in a signal processor in the subsequent stage before generating a reproducing signal by obtaining a difference between these signals.

The reproducing signal amplifier preferably further comprises a delay circuit for receiving the amplified signal and delaying a phase of the amplified signal so as to be supplied to the amplified signal output terminal. Thus, the phase of the amplified signal having passed through the delay circuit can accord with the phase of the central value signal, and hence, both phases of the amplified signal and the central value signal can attain fidelity to the input signal.

The central value signal generator of this invention comprises a voltage generation circuit for detecting a potential of the input signal and generating a voltage substantially equal to the potential of the input signal so as to be output as a voltage signal; and a low-pass filter for receiving the voltage signal and generating the central value signal by removing a high frequency component from the voltage signal.

In the central value signal generator, the voltage generation circuit detects the potential of the input signal and outputs the voltage signal having a potential substantially equal to the potential of the input signal, and then the low-pass filter removes the high frequency component from the voltage signal. Thus, the DC component of the input signal can be obtained.

In the central value signal generator, the voltage generation circuit preferably includes a first PNP transistor for receiving the input signal at the base thereof, whose emitter is connected with a power supply via a first current source and whose collector is grounded; a first NPN transistor for receiving the input signal at the base thereof, whose emitter is grounded via a second current source and whose collector is connected with the power supply; a second PNP transistor whose emitter is connected with the power supply via the first current source and whose collector is grounded; a second NPN transistor whose emitter is grounded via the second current source and whose collector is connected with the power supply; and an output terminal connected with the bases of the second PNP transistor and the second NPN transistor for outputting the amplified signal, and the low-pass filter preferably includes a capacitor connected with the output terminal at one electrode thereof and grounded at the other electrode thereof.

Thus, the input signal is supplied to the bases of the first PNP transistor and the first NPN transistor connected with each other, and hence, the central value signal generator can attain high sensitivity against a small signal.

Furthermore, the second PNP transistor is connected with the power supply via the first current source at its emitter and grounded at its collector, the second NPN transistor is grounded via the second current source at its emitter and connected with the power supply at its collector, and the second PNP transistor and the second NPN transistor are connected with each other at their bases. Accordingly, the potential of the output signal is substantially equal to the potential of the input signal.

In addition, since the low-pass filter includes the capacitor connected with the output terminal at one electrode and grounded at the other electrode, it is possible to smooth the AC component of the output signal of the voltage generation circuit so as to generate the central value signal of the input signal.

DETAILED DESCRIPTION OF THE INVENTION (Embodiment 1)

Embodiment 1 of the invention will now be described referring to the accompanying drawing.

Figure 1:
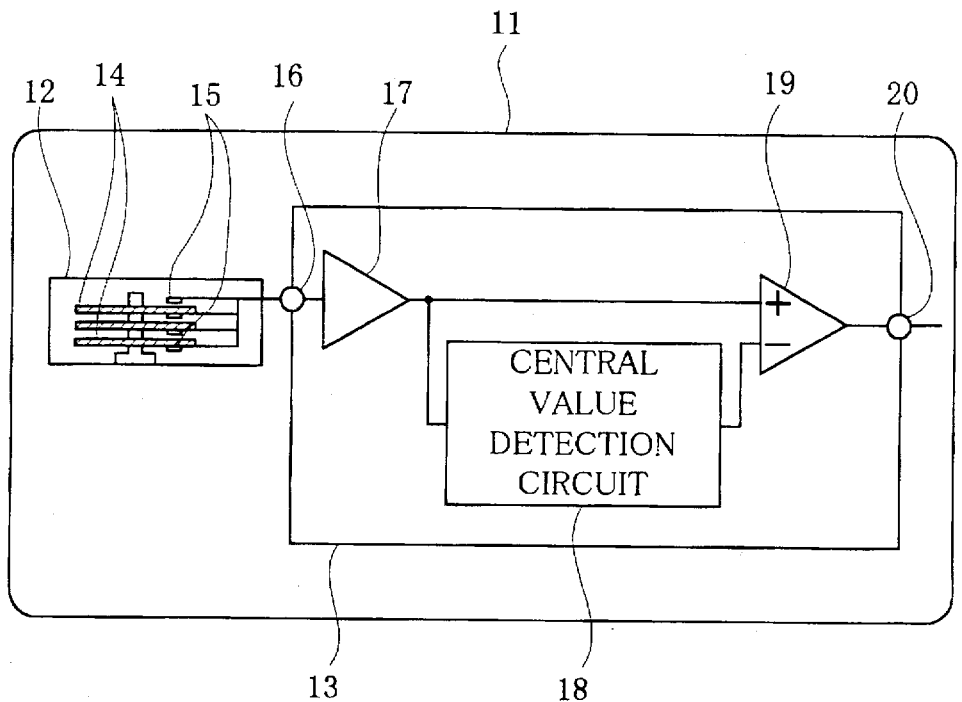
FIG. 1 is a diagram for showing the configuration of a reproducing signal amplifier used in a magnetic recording device according to a first embodiment of the invention.

FIG. 1 is a diagram for showing the configuration of a reproducing signal amplifier used in a magnetic recording device of this embodiment. As is shown in FIG. 1, the magnetic recording device 11 comprises a magnetic disk drive 12 for recording desired information as a magnetic signal and a reproducing signal amplifier 13 for amplifying a small electric signal obtained by converting the magnetic signal.

The magnetic disk drive 12 comprises magnetic media 14 formed by piling a plurality of disks of aluminum or the like, on both surfaces of which information is recorded as the magnetic signal, and reproducing heads 15, such as a thin-film induction type head or a magneto-resistance effect (MR) head, for converting the magnetic signal recorded on each magnetic medium 14 into an electric signal, that is, small variation of a voltage or current.

The reproducing signal amplifier 13 includes an input terminal 16 for receiving a small electric signal read by one of the reproducing heads 15 of the magnetic disk drive 12, an amplifier 17 for amplifying the small electric signal input through the input terminal 16 into an amplified signal having an appropriate amplitude, a central value detection circuit 18 serving as a central value signal generator for detecting the central value of the AC component of the amplified signal output by the amplifier 17 and outputting a central value signal consisting of the DC component of the amplified signal, a subtracter 19 for obtaining a difference between the amplified signal and the central value signal and outputting a reproducing signal, and an output terminal 20 for outputting the difference as the reproducing signal.

The reproducing signal output by the subtracter 19 is supplied to a signal processor (not shown) in a subsequent stage, so as to reproduce the information recorded as variation of the magnetic signal.

The magnetic recording device 11 and the reproducing signal amplifier 13 are operated as follows:

First, as is shown in FIG. 1, the magnetic signal recorded on the magnetic medium 14 of the magnetic disk drive 12 is read as a small electric signal by the reproducing head 15, and supplied to the input terminal 16 of the reproducing signal amplifier 13. Then, this input signal having a small electric energy is input to the amplifier 17 for amplification, and supplied to one input terminal of the subtracter 19 as an amplified signal. At the same time, the amplified signal is input to the central value detection circuit 18 connected in series between the amplifier 17 and the subtracter 19. In the central value detection circuit 18, the central value of the AC component of the amplified signal, that is, the DC component at a bias level obtained by removing the AC component from the amplified signal, is detected and converted into a central value signal. The central value signal is output by the central value detection circuit 18, so as to be supplied to the other input terminal of the subtracter 19. Then, in the subtracter 19, the central value signal, that is, the DC component at the bias level of the amplified signal, is subtracted from the amplified signal, so as to remove the variation at the bias level of the amplified signal. This is because an abruptly changing noise with a large amplitude includes a component for largely varying the bias level of the amplified signal.

Thus, when an abruptly changing noise with a large amplitude as compared with a normal input signal is applied to the input signal, the noise can be removed. As a result, a reproducing signal including few reproduction errors can be obtained.

The reproducing signal amplifier of this invention is not limited to a hard disk drive as is described in this embodiment but can be any device for reproducing a magnetically recorded signal such as a magnetic floppy disk drive, a magnetic tape unit and a magnetic VTR.

Furthermore, the reproducing signal amplifier of this invention is effective not only for the magnetic recording device but also for any recording device in which a signal recorded on a recording medium is small and an abruptly changing noise with a large amplitude is superimposed on the signal.

(Embodiment 2)

Embodiment 2 of the invention will now be described referring to the accompanying drawing.

Figure 2:
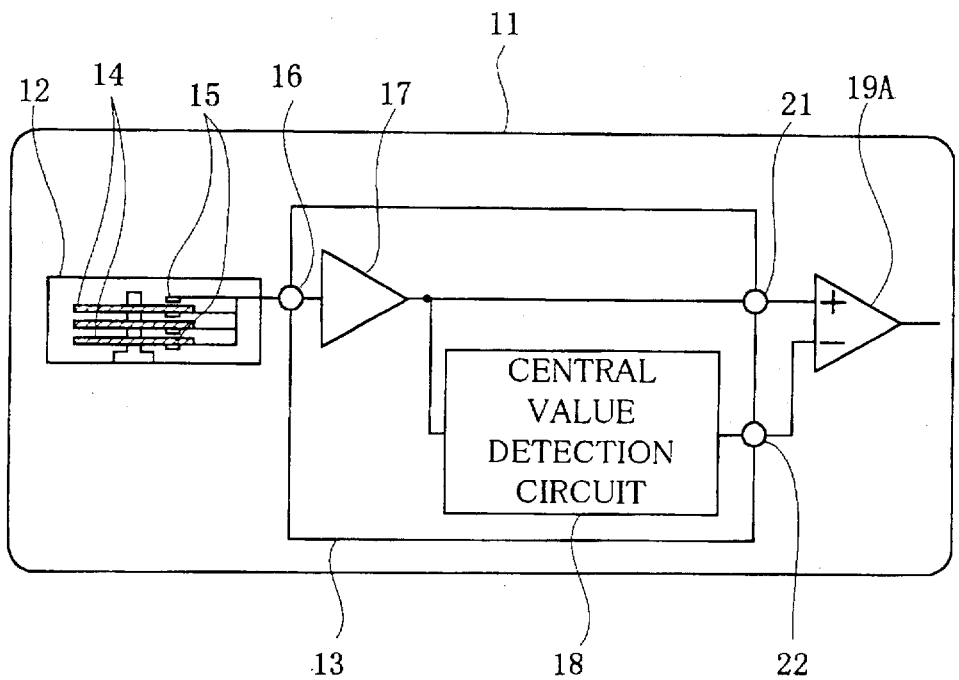
FIG. 2 is a diagram for showing the configuration of a reproducing signal amplifier used in a magnetic recording device according to a second embodiment of the invention.

FIG. 2 is a diagram for showing the configuration of a reproducing signal amplifier used in a magnetic recording device of Embodiment 2. In FIG. 2, like reference numerals are used to refer to like elements shown in FIG. 1, and the description of these elements is omitted.

As a characteristic of this embodiment, the reproducing signal amplifier 13 includes an amplified signal output terminal 21 for outputting the amplified signal from the amplifier 17 directly to the outside, and a central value signal output terminal 22 for outputting the central value signal from the central value detection circuit 18 directly to the subsequent stage.

Thus, as is shown in FIG. 2, a difference between the amplified signal output through the amplified signal output terminal 21 and the central value signal output through the central value output terminal 22 is obtained by a subtracter 19A in the subsequent stage. Accordingly, not only an abruptly changing noise with a large amplitude can be removed, but also, for example, the central value signal can be monitored before entering the subtracter 19A in the signal processor in the subsequent stage. In this manner, a degree of freedom in the signal processing of the reproducing signal in the subsequent stage can be increased.

(Embodiment 3)

Embodiment 3 of the invention will now be described referring to the accompanying drawing.

Figure 3:
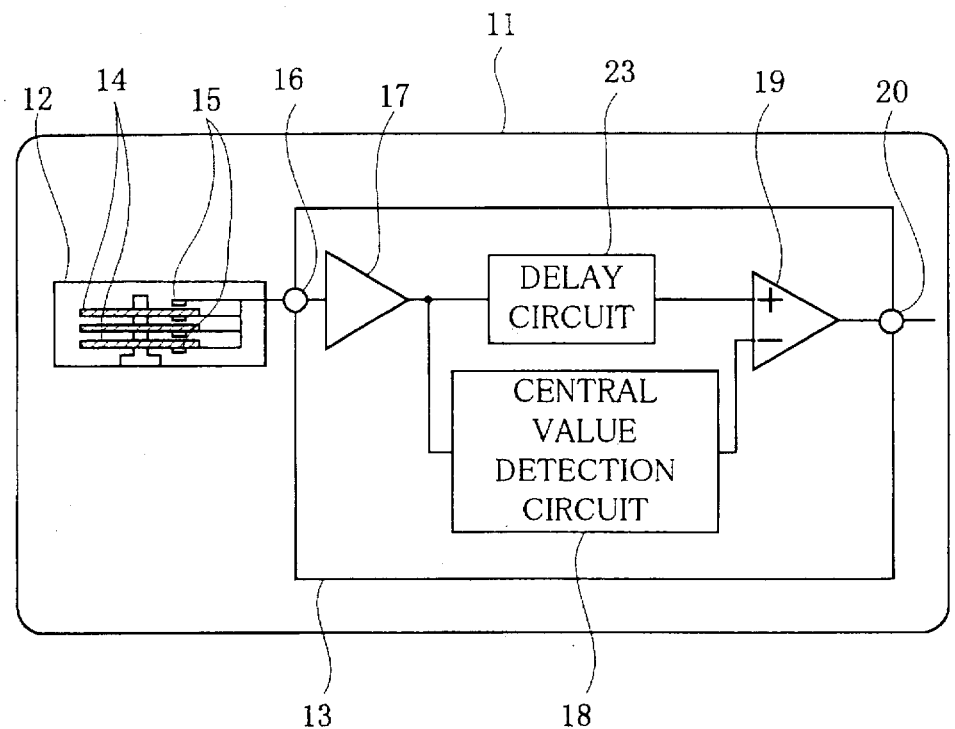
FIG. 3 is a diagram for showing the configuration of a reproducing signal amplifier used in a magnetic recording device according to a third embodiment of the invention.

FIG. 3 is a diagram for showing the configuration of a reproducing signal amplifier used in a magnetic recording device of this embodiment. In FIG. 3, like reference numerals are used to refer to like elements shown in FIG. 1, and the description of these elements is omitted.

As a characteristic of this embodiment, the reproducing signal amplifier 13 includes a delay circuit 23 connected in series between the amplifier 17 and the subtracter 19 for delaying the phase of the amplified signal output by the amplifier 17.

Thus, even when the phase of the central value signal output by the central value detection circuit 18 is delayed as compared with the phase of the amplified signal output by the amplifier 17 because the amplified signal passes through the central value detection circuit 18, the delay circuit 23 can delay the phase of the amplified signal. As a result, the noise can be more definitely removed.

(Embodiment 4)

Embodiment 4 of the invention will now be described referring to the accompanying drawing.

Figure 4:
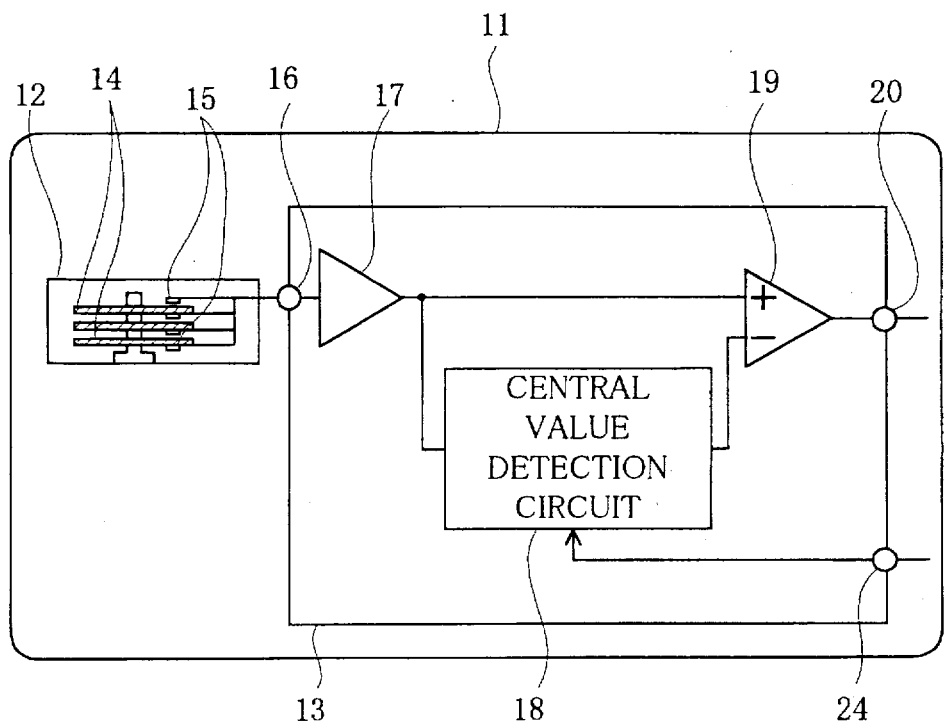
FIG. 4 is a diagram for showing the configuration of a reproducing signal amplifier used in a magnetic recording device according to a fourth embodiment of the invention.

FIG. 4 is a diagram for showing the configuration of a reproducing signal amplifier used in a magnetic recording device of this embodiment. In FIG. 4, like reference numerals are used to refer to like elements shown in FIG. 1, and the description of these elements is omitted.

As a characteristic of this embodiment, the reproducing signal amplifier 13 includes an on/off control terminal 24 connected with on/off control means for controlling the start or the halt of the operation of the central value detection circuit 18.

Thus, in addition to the removal of an abruptly changing noise with a large amplitude by the subtracter 19, the central value detection circuit 18 can be halted, so that the amplified signal output by the amplifier 17 can be directly output as the reproducing signal to the subsequent stage. As a result, even when there is a case where the amplified signal is desired to be utilized without any process depending upon the type or the form of the amplifier 17, it is possible to output the amplified signal without any process by halting the central value detection circuit 18.

(Embodiment 5)

Embodiment 5 of the invention will now be described referring to the accompanying drawing.

Figure 5:
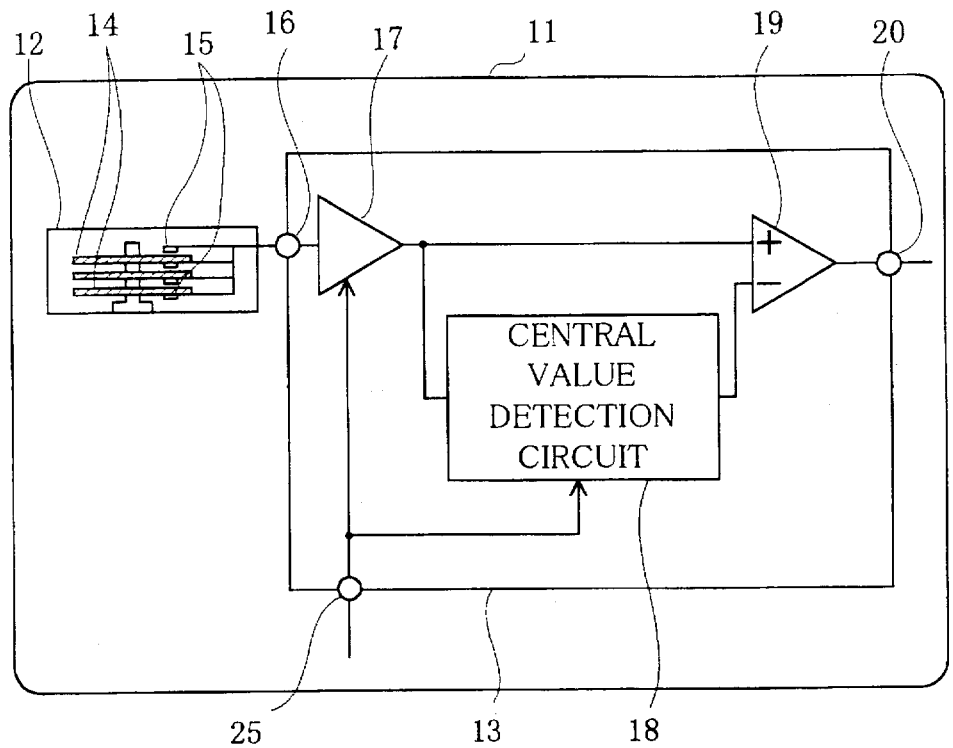
FIG. 5 is a diagram for showing the configuration of a reproducing signal amplifier used in a magnetic recording device according to a fifth embodiment of the invention.

FIG. 5 is a diagram for showing the configuration of a reproducing signal amplifier used in a magnetic recording device of this embodiment. In FIG. 5, like reference numerals are used to refer to like elements shown in FIG. 1, and the description of these elements is omitted.

As a characteristic of this embodiment, the reproducing signal amplifier 13 includes a gain control terminal 25 connected in parallel with the amplifier 17 and the central value detection circuit 18 and also connected with gain control means for increasing/decreasing the gain of the amplifier 17.

Thus, in addition to the removal of an abruptly changing noise with a large amplitude by the subtracter 19 in reproduction, the gain of the amplifier 17 can be decreased before mode switching between the recording mode for writing a signal on the magnetic medium 14 and the reproducing mode for reading a signal from the magnetic medium 14, so that a noise derived from abrupt change of a signal, which tends to be caused in the mode switching, can be suppressed to a minimum. As a result, the error operation of a signal processor and the like in the subsequent stage can be prevented.

(Embodiment 6)

Embodiment 6 of the invention will now be described referring to the accompanying drawing.

Figure 6:
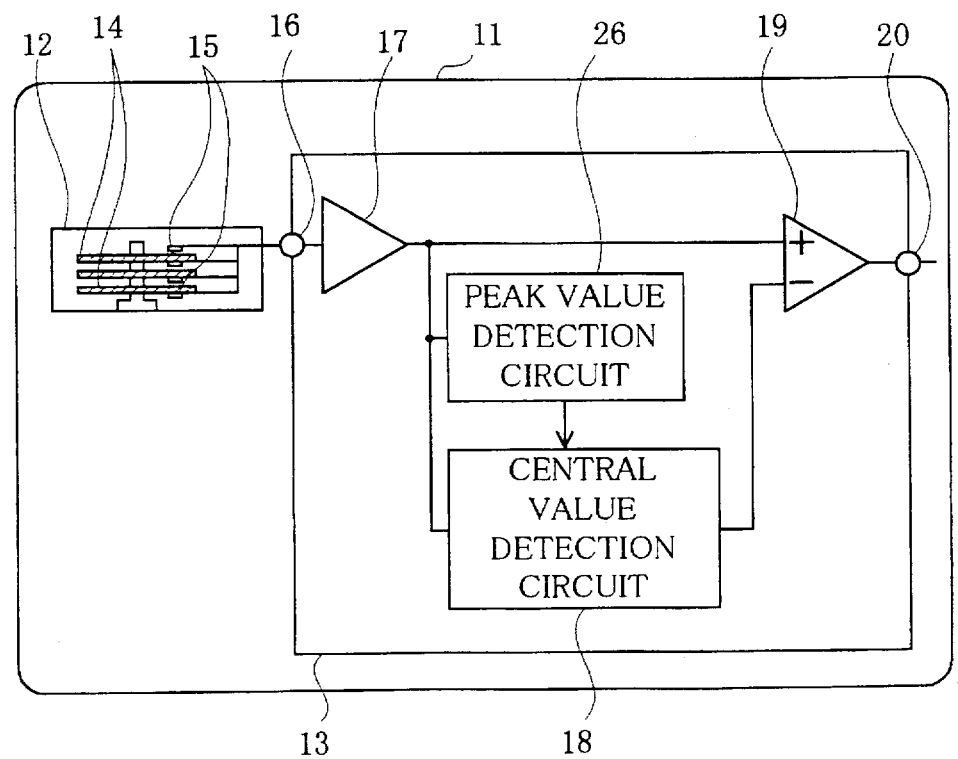
FIG. 6 is a diagram for showing the configuration of a reproducing signal amplifier used in a magnetic recording device according to a sixth embodiment of the invention.

FIG. 6 is a diagram for showing the configuration of a reproducing signal amplifier used in a magnetic recording device of this embodiment. In FIG. 6, like reference numerals are used to refer to like elements shown in FIG. 1, and the description of these elements is omitted.

As a characteristic of this embodiment, the reproducing signal amplifier 13 includes a peak value detection circuit 26 connected in series between the amplifier 17 and the central value detection circuit 18 for detecting a peak value of the amplitude at the bias level of the amplified signal output by the amplifier 17 and outputting the peak value to the central value detection circuit 18.

When the conversion characteristic of the reproducing head 15, the gain characteristic of the amplifier 17 and the like are changed, the peak value at the bias level of the amplified signal output by the amplifier 17 is changed, so that the characteristic of the central value detection circuit 18 can deviate from the predetermined one. Since the peak value detection circuit 26 detects the peak value of the amplified signal and outputs the detected peak value to the central value detection circuit 18, the central value detection circuit 18 can attain the predetermined characteristic on the basis of the detected peak value.

Thus, in addition to the removal of an abruptly changing noise with a large amplitude by the subtracter 19, the central value detection circuit 18 can adjust its detection characteristic for the central value of an input signal as well as its generation characteristic on the basis of the peak value of the amplitude at the bias level supplied by the peak value detection circuit 26. As a result, the central value of the amplified signal output by the amplifier 17 can be accurately detected.

As a result, a noise having an abruptly varying large amplitude can be more definitely removed by the subtracter 19.

(Embodiment 7)

Embodiment 7 of this invention will now be described referring to the accompanying drawing.

Figure 7:
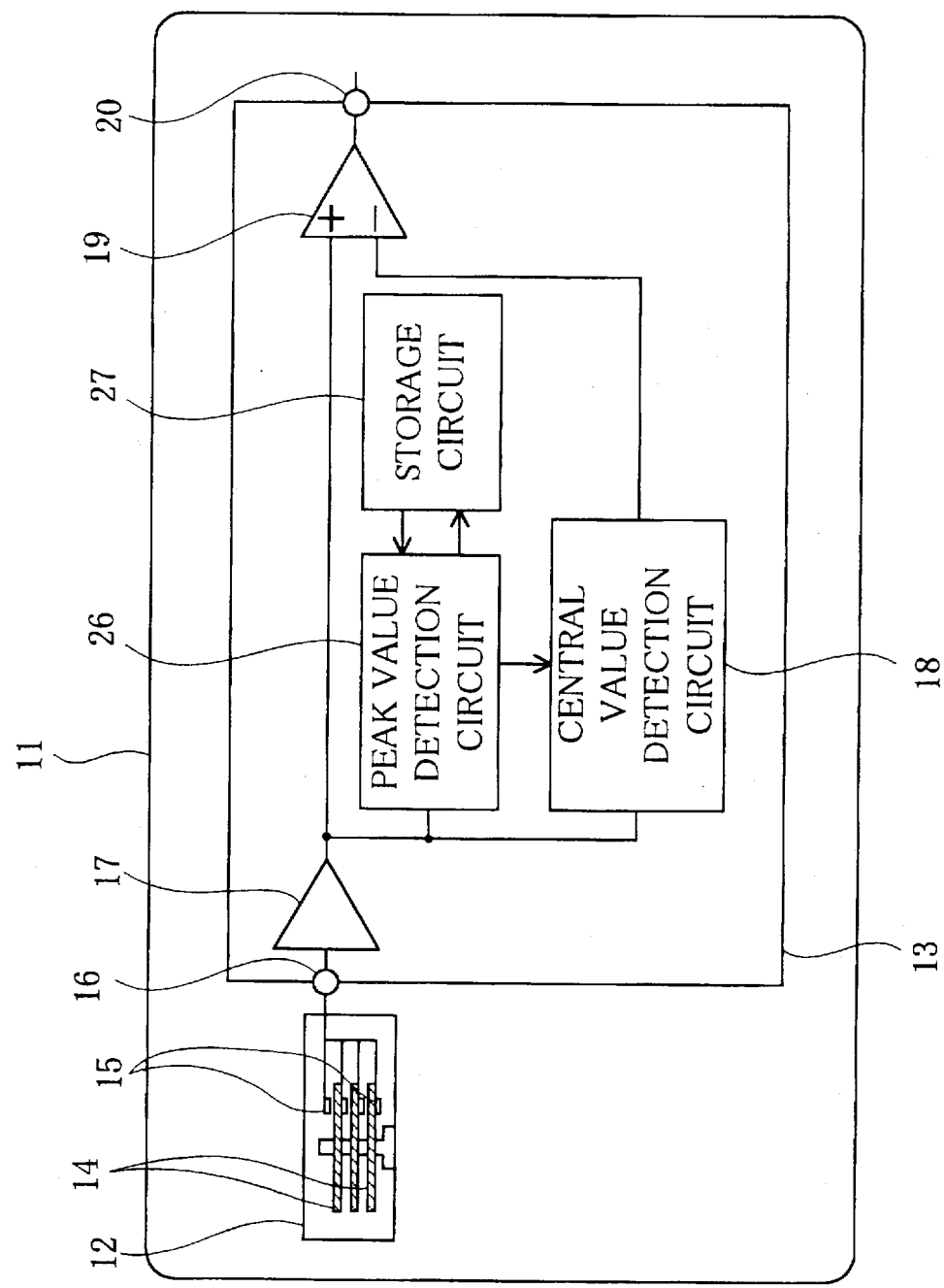
FIG. 7 is a diagram for showing the configuration of a reproducing signal amplifier used in a magnetic recording device according to a seventh embodiment of the invention.

FIG. 7 is a diagram for showing the configuration of a reproducing signal amplifier used in a magnetic recording device of this embodiment. In FIG. 7, like reference numerals are used to refer to like elements shown in FIG. 6, and the description of these elements is omitted.

As a characteristic of this embodiment, the reproducing signal amplifier 13 includes a storage circuit 27 consisting of a nonvolatile memory such as a flash EEPROM for storing the peak value of the amplitude of the amplified signal from the amplifier 17 detected by the peak value detection circuit 26.

When the magnetic recording device 11 is activated, peak value data at the bias level stored in the storage circuit 27 is output as an initial value to the central value detection circuit 18 via the peak value detection circuit 26. When the peak value of the amplitude of the amplified signal output by the amplifier 17 is changed, the peak value detection circuit 26 detects the change so that the peak value held by the storage circuit 27 is updated to a changed peak value.

In this manner, the storage circuit 27 always stores the peak value of the amplitude of the amplified signal output by the amplifier 17 no matter whether the magnetic recording device 11 is supplied with power. Therefore, this reproducing signal amplifier 13 can deal with the variation of the peak value of the amplified signal, and hence, the central value can be more accurately detected. As a result, in the case where an abruptly changing noise with a large amplitude as compared with a normal input signal is applied to the input signal, a reproducing signal including few reproduction errors can be obtained by removing the noise.

(Embodiment 8)

Embodiment 8 of this invention will now be described referring to the accompanying drawing.

Figure 8:
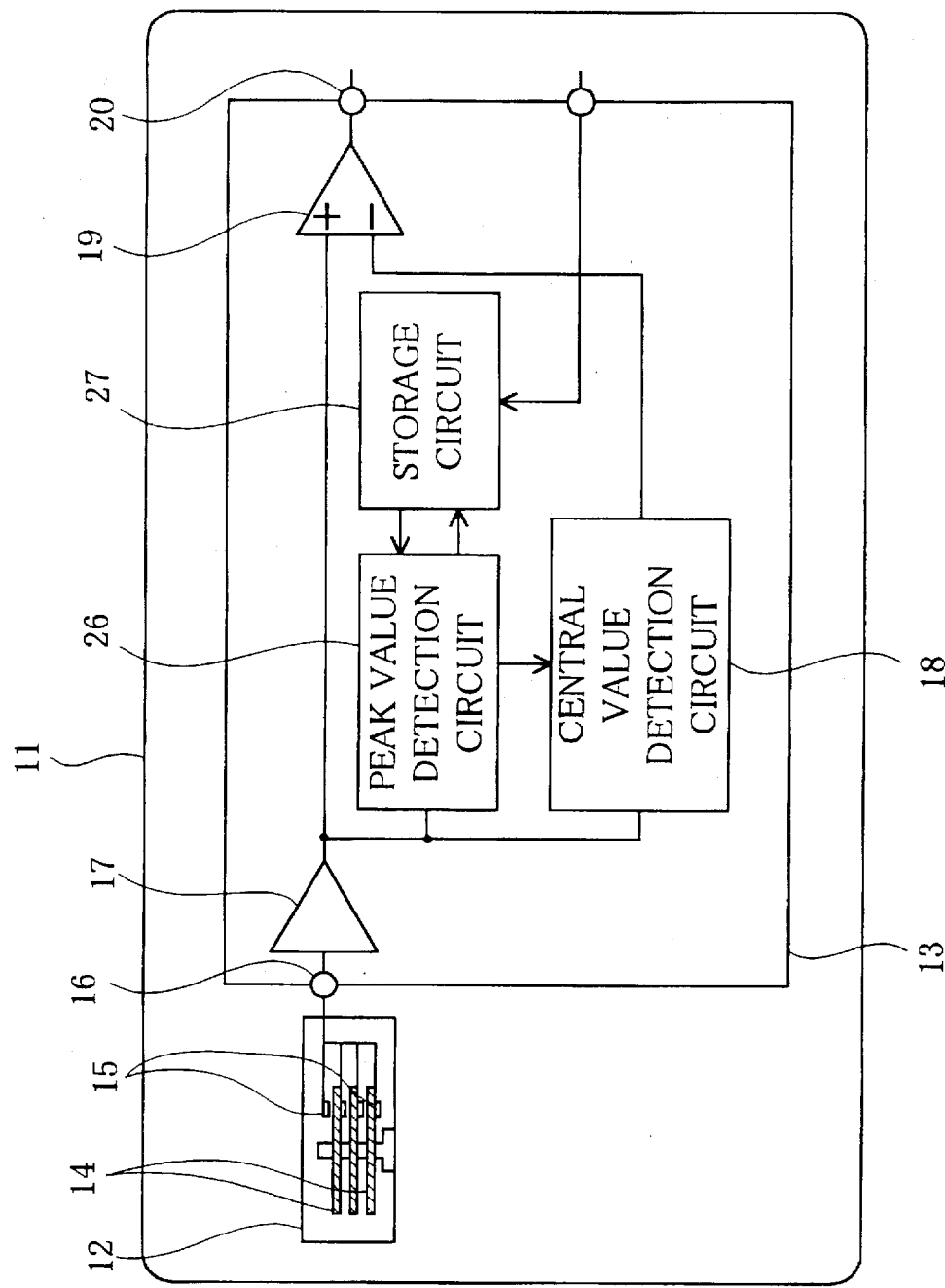
FIG. 8 is a diagram for showing the configuration of a reproducing signal amplifier used in a magnetic recording device according to an eighth embodiment of the invention.

FIG. 8 is a diagram for showing the configuration of a reproducing signal amplifier used in a magnetic recording device of this embodiment. In FIG. 8, like reference numerals are used to refer to like elements shown in FIG. 7, and the description of these elements is omitted.

As a characteristic of this embodiment, the reproducing signal amplifier 13 includes a peak value control terminal 28 connected with peak value control means for referring or changing the peak value at the bias level of the amplified signal from the amplifier 17 stored in the storage circuit 27.

Thus, the peak value stored in the storage circuit 27 can be read or directly changed, and hence, the central value of the amplified signal output by the amplifier 17 can be more accurately detected. As a result, an abruptly changing noise with a large amplitude superimposed on the amplified signal can be definitely removed.

(Embodiment 9)

Embodiment 9 of this invention will now be described referring to the accompanying drawing.

Figure 9:
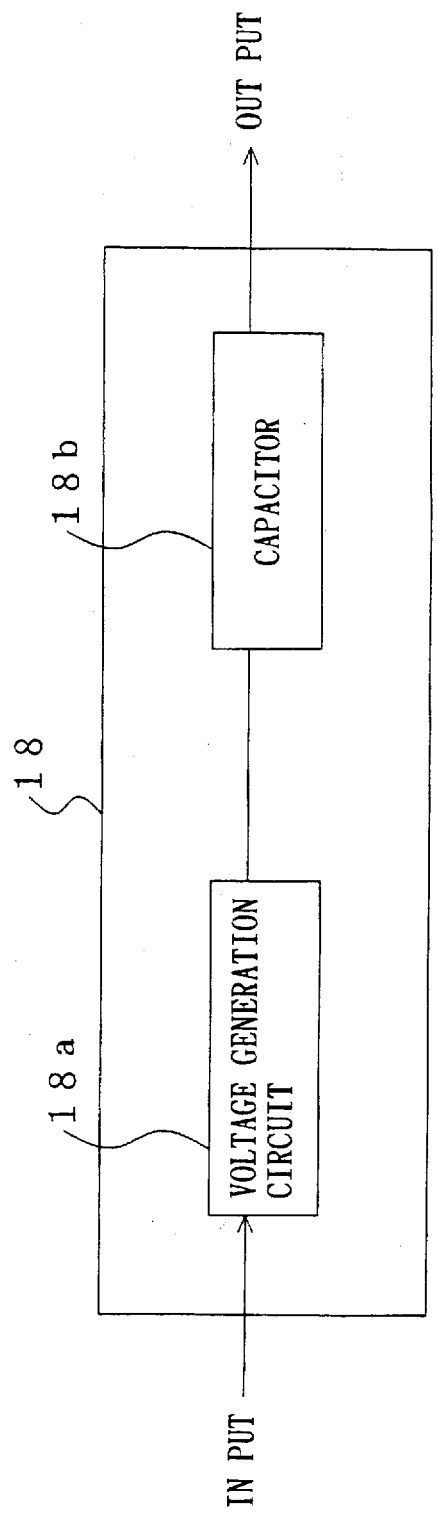
FIG. 9 is a diagram for showing the configuration of a central value detection circuit according to a ninth embodiment of the invention.

FIG. 9 is a diagram for showing the configuration of a central value detection circuit of this embodiment. As is shown in FIG. 9, the central value detection circuit serving as a central value signal generator includes a voltage generation circuit 18$a$ for generating and outputting a potential substantially equal to the potential of an input signal and a capacitor 18$b$ for smoothing the AC component of the output signal of the voltage generation circuit 18$a$.

Figure 10:
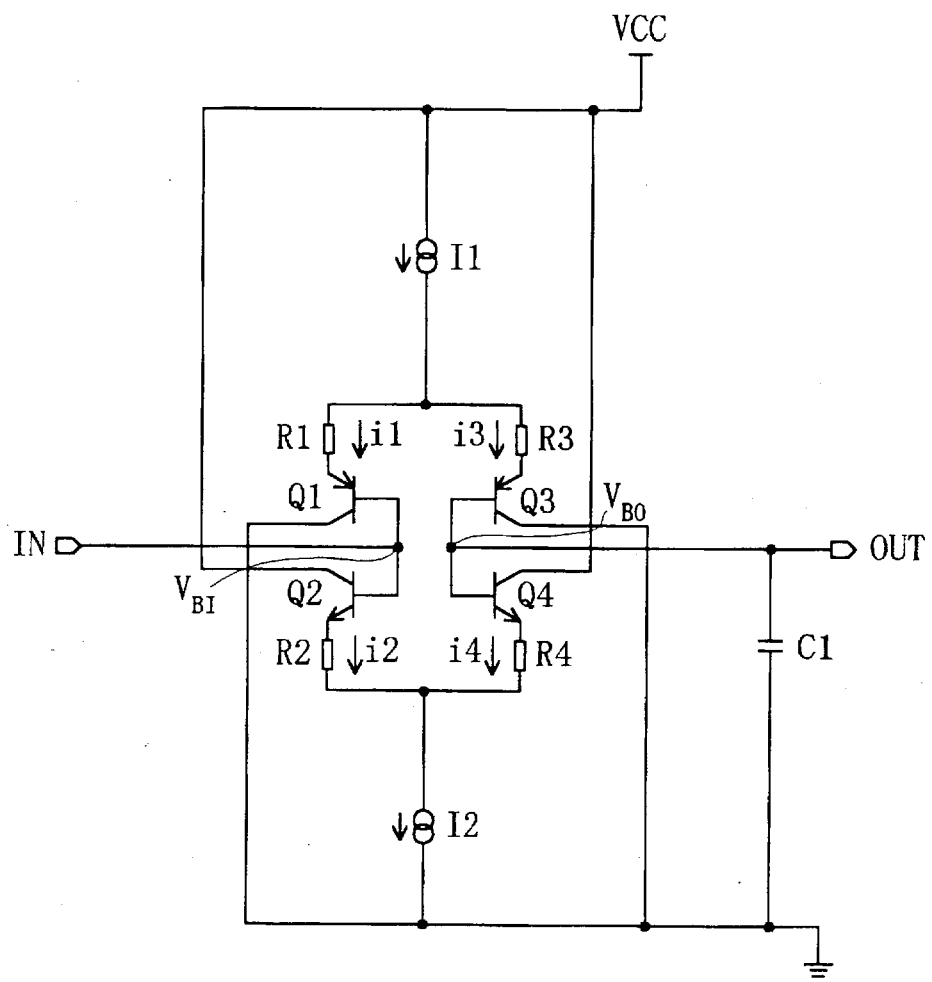
FIG. 10 is a circuit diagram of the central value detection circuit of the ninth embodiment.

FIG. 10 is a circuit diagram of the central value detection circuit of this embodiment. As is shown in FIG. 10, a first PNP transistor Q1 at the input port is connected with an input terminal IN at its base, connected with a power supply VCC via a first resistance R1 and a first current source I1 at its emitter, and grounded at its collector.

A first NPN transistor Q2 is connected with the input terminal IN at its base, grounded via a second resistance R2 and a second current source I2 at its emitter, and connected with the power supply VCC at its collector.

A second PNP transistor Q3 at the output port is connected with the power supply VCC via a third resistance R3 and the first current source I1 at its emitter, grounded at its collector and connected with an output terminal OUT at its base.

A second NPN transistor Q4 is grounded via a fourth resistance R4 and the second current source I2 at its emitter, connected with the power supply VCC at its collector and connected with the output terminal OUT at its base.

A capacitor C1 serving as a low-pass filter is connected with the output terminal OUT at one electrode thereof and is grounded at the other electrode.

The first PNP transistor Q1 and the second PNP transistor Q3 have the same transistor size, and the first NPN transistor Q2 and the second NPN transistor Q4 have the same transistor size. Also, the first resistance R1 and the third resistance R3 have the same resistance value, and the second resistance R2 and the fourth resistance R4 have the same resistance value. These conditions regarding the transistor sizes and the resistance values are also applied to the following embodiments.

Now, the operation of the central value detection circuit having the aforementioned configuration will be described referring to the drawing.

First, referring to FIG. 10, the case where the central value detection circuit is stably operated will be described. The first PNP transistor Q1 and the second PNP transistor Q3 have the same size, the first resistance R1 and the third resistance R3 have the same resistance value and the first current source I1 is capable of always supplying a constant current. Therefore, when a current flowing to the emitter of the first PNP transistor Q1 is indicated as an emitter current i1 and a current flowing to the emitter of the second PNP transistor Q3 is indicated as an emitter current i3, the following relationships hold:

$$I1 = i1 + i3 \quad (1)$$

$$i1 = i3 \quad (2)$$

Similarly, the first NPN transistor Q2 and the second NPN transistor Q4 have the same size, the second resistance R2 and the fourth resistance R4 have the same resistance value and the current source I2 is capable of always supplying a constant current. Therefore, when a current flowing from the emitter of the first NPN transistor Q2 is indicated as an emitter current i2 and a current flowing from the emitter of the second NPN transistor Q4 is indicated as an emitter current i4, the following relationships hold:

$$I2 = i2 + i4 \quad (3)$$

$$i2 = i4 \quad (4)$$

Next, when a voltage higher than a normal level is applied to the input terminal IN, a base potentials $V_{BI}$ at the input port of the first PNP transistor Q1 and the first NPN transistor Q2 are increased in accordance with the applied voltage. When the base potential $V_{BI}$ at the input port is increased, the emitter current i1 of the first PNP transistor Q1 is decreased. Therefore, the relationship between the emitter current i1 and the emitter current i3 which have been equally supplied by the current source I1 as is represented by the formula (2) is changed as follows:

$$i1 < i3 \quad (5)$$

Furthermore, when the base potential $V_{BI}$ at the input port of the first NPN transistor Q2 is increased, the emitter current i2 is increased. Therefore, the relationship between the emitter current i2 and the emitter current i4 which have been equally supplied to the second current source I2 as is represented by the formula (4) is changed as follows:

$$i2 > i4 \quad (6)$$

Accordingly, because of the relationships represented by the formulas (5) and (6), when the voltage higher than normal level is applied to the input terminal IN, the emitter current i3 of the second PNP transistor Q3 is increased and the emitter current i4 of the second NPN transistor Q4 is decreased, resulting in increasing a base potential $V_{BO}$ at the output port. This charges the capacitor C1. When the capacitor C1 is charged and the base potential $V_{BI}$ at the input port attains the same level as the base potential $V_{BO}$ at the output port, that is, the potential of the output terminal of the voltage generation circuit, the operation of the central value detection circuit is stabilized.

Furthermore, since the capacitor C1 works as a low-pass filter, actual information including a high frequency component superimposed on the bias signal component (for example, information of 0 or 1 obtained as an electric signal by converting a recording signal on the magnetic media in Embodiment 1) can be removed, so that a voltage approximate to the DC component can be output.

In contrast, when a voltage lower than the normal level is applied to the input terminal IN, the reverse operation to that described above is conducted. Therefore, the relationship between the emitter current i1 and the emitter current i3 is changed as follows:

$$i1 > i3 \quad (7)$$

The relationship between the emitter current i2 and the emitter current i4 is changed as follows:

$$i2 < i4 \quad (8)$$

Accordingly, because of the relationships represented by the formulas (7) and (8), when the voltage lower than the normal level is applied to the input terminal IN, the base potential $V_{BO}$ at the output port is decreased. This discharges the capacitor C1. When the capacitor C1 is discharged and the base potential $V_{BI}$ at the input port and the base potential $V_{BO}$ at the output port attain the same level, the operation of the central value detection circuit is stabilized.

In this case, the resistances R1 through R4 are used in order to adjust the dynamic ranges between a voltage difference between the input signal and the output signal of the central value detection circuit, and base currents of the first PNP transistor Q1 and the first NPN transistor Q2 and collector currents of the second PNP transistor Q3 and the second NPN transistor Q4.

In this manner, the AC component of the input signal can be smoothed, and hence, the central value of the input signal can be definitely detected.

As a characteristic of this embodiment, it goes without saying that the central value detection circuit never affects the input signal because the part on the side of the input terminal IN and the part on the side of the output terminal OUT are electrically separated. In addition, since the input signal is supplied to the base of the bipolar transistor, a sensitivity against a small change of the input signal can be set at a high level. Therefore, this central value detection circuit is suitable to deal with a small signal like a signal recorded on a magnetic recording medium.

It is noted that the central value detection circuit used in the reproducing signal amplifier of this invention is not limited to this embodiment but can be a DC detection circuit which includes an RC circuit and the like and is sensitive to a small signal.

(Embodiment 10)

Embodiment 10 of the invention will now be described referring to the accompanying drawings.

Figure 11:
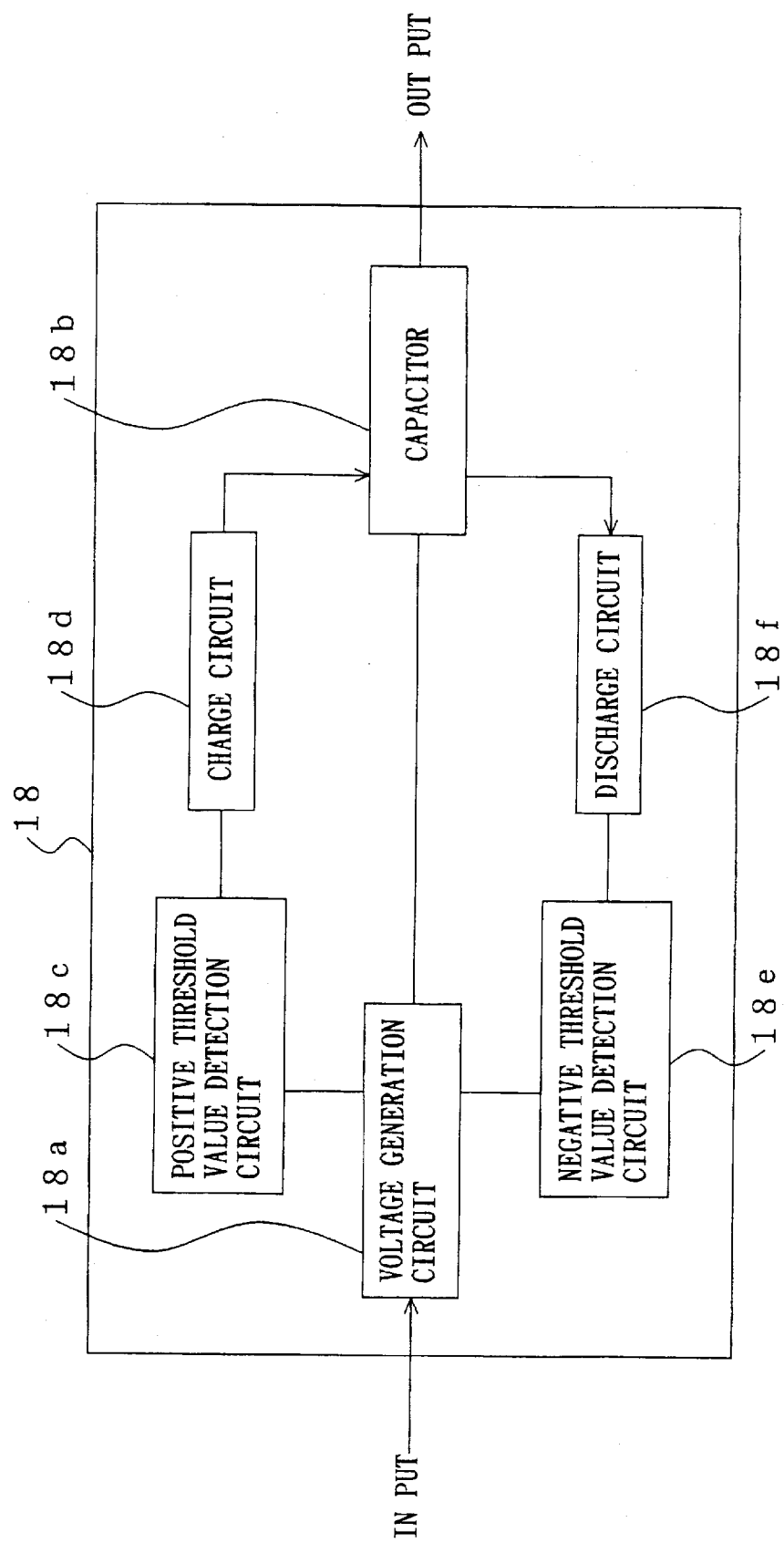
FIG. 11 is a diagram for showing the configuration of a central value detection circuit according to a tenth embodiment.

FIG. 11 is a diagram for showing the configuration of a central value detection circuit used in a reproducing signal amplifier of this embodiment. In FIG. 11, the central value detection circuit 18 includes a positive threshold value detection circuit 18c connected with a voltage generation circuit 18a for detecting a predetermined positive threshold value when a voltage higher than the normal level, that is, a signal exceeding the predetermined positive threshold value, is input, and a charge circuit 18d supplied with the result of the detection based on a positive threshold value exceeding signal component for charging a capacitor 18b. Furthermore, the central value detection circuit 18 includes a negative threshold value detection circuit 18e connected with the voltage generation circuit 18a for detecting a predetermined negative threshold value when a voltage lower than the normal level, that is, a signal exceeding the predetermined negative threshold value in the absolute value, is input, and a discharge circuit 18f supplied with the result of the detection based on a negative threshold value exceeding signal component for discharging the capacitor 18b.

In this case, the threshold values have the following meaning: When the amplitude of the AC component of an input signal is assumed to be ±10 mV, the positive threshold value is set at +6 mV and the negative threshold value is set at −6 mV.

Figure 12:
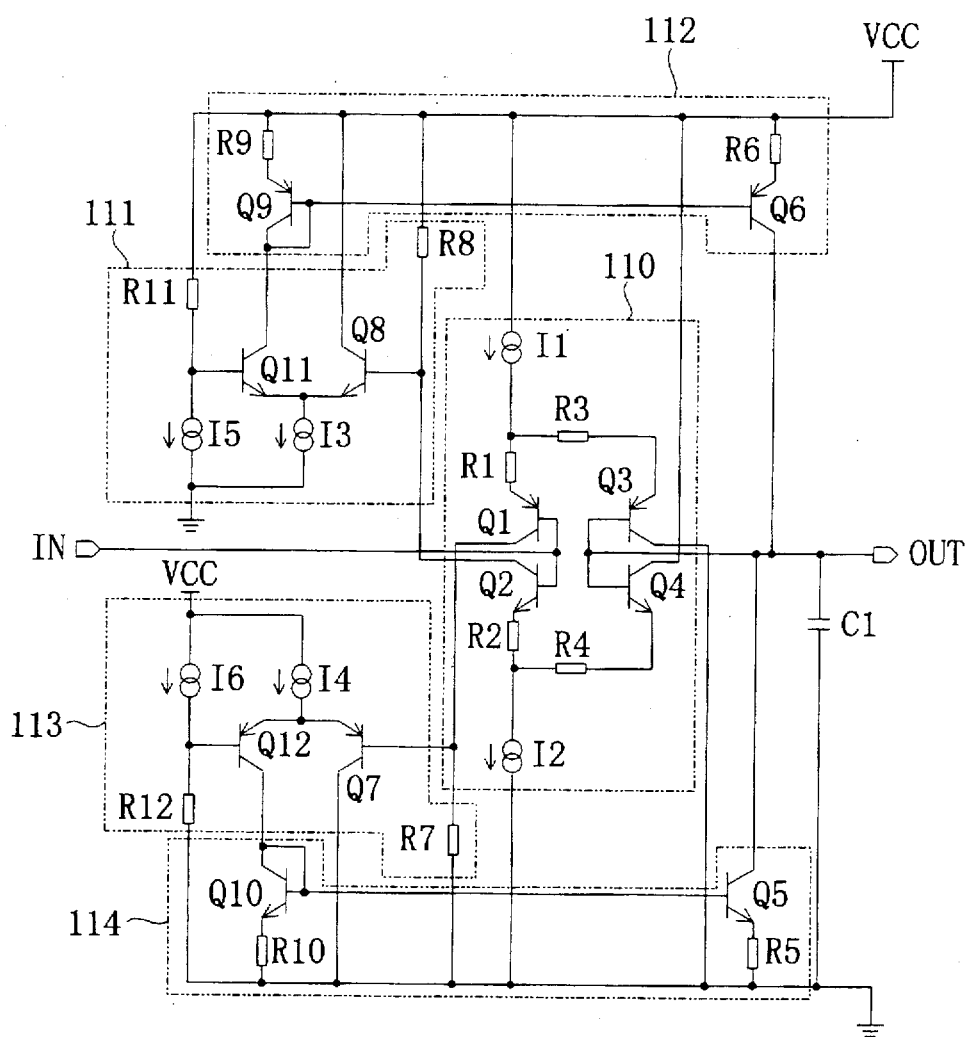
FIG. 12 is a circuit diagram of the central value detection circuit of the tenth embodiment.

FIG. 12 is a circuit diagram of the central value detection circuit of this embodiment. In FIG. 12, similarly to Embodiment 9 shown in FIG. 10, Q1 indicates a first PNP transistor, Q2 indicates a first NPN transistor, Q3 indicates a second PNP transistor, Q4 indicates a second NPN transistor, R1 indicates a first resistance, R2 indicates a second resistance, R3 indicates a third resistance, R4 indicates a fourth resistance, I1 indicates a first current source, I2 indicates a second current source, C1 indicates a capacitor, IN indicates an input terminal and OUT indicates an output terminal.

Furthermore, Q6, Q7, Q9 and Q12 indicate other PNP transistors, Q5, Q8, Q10 and Q11 indicate other NPN transistors, I3 through I6 indicate other current sources and R5 through R12 indicate other resistances.

As is shown in FIG. 12, a voltage generation circuit 110 includes the first PNP transistor Q1, the first NPN transistor Q2, the second PNP transistor Q3, the second NPN transistor Q4, the first resistance R1, the second resistance R2, the third resistance R3, the fourth resistance R4 and the current sources I1 and I2.

A positive threshold value detection circuit 111 includes the resistance R11 and the current source I5 together serving as means for setting a positive threshold value in a voltage corresponding to the amplitude in the positive direction of the AC component of the input signal. The resistance R11 is connected with a power supply VCC at one end thereof and connected with the input port of the current source I5 at the other end, and the current source I5 is grounded at the output port.

The positive threshold value detection circuit 111 further includes the resistance R8, the NPN transistors Q8 and Q11 and the current source I3 for detecting the positive threshold value. The resistance R8 is connected with the power supply VCC at one end and connected with the collector of the first NPN transistor Q2 at the other end. The NPN transistor Q8 is connected with the collector of the first NPN transistor Q2 at its base, connected with the power supply VCC at its collector, and connected with the input port of the current source I3 at its emitter. The NPN transistor Q11 is connected with the input port of the current source I5 at its base, connected with a charge circuit 112 described below at its collector, and connected with the input port of the current source I3 at its emitter.

The charge circuit 112 is a current mirror circuit including the resistances R6 and R9 and the PNP transistors Q6 and Q9, and charges the capacitor C1 more rapidly than the voltage generation circuit 110. The resistance R6 is connected with the power supply VCC at one end and connected with the emitter of the PNP transistor Q6 at the other end. The PNP transistor Q6 is connected with the base of the PNP transistor Q9 at its base and connected with the output terminal OUT at its collector. The resistance R9 is connected with the power supply VCC at one end and connected with the emitter of the PNP transistor Q9 at the other end. The PNP transistor Q9 is connected with its own collector and with the base of the PNP transistor Q6 at its base and connected with the collector of the NPN transistor Q11 at its collector.

With regard to the discharging part, the composing elements alone will be described. A negative threshold value detection circuit 113 includes the resistance R12 and the current source I6 together serving as means for setting a negative threshold value in a voltage corresponding to the amplitude in the negative direction of the AC component of the input signal, and further includes the resistance R7, the PNP transistors Q7 and Q12 and the current source I4 for detecting the negative threshold value.

A discharge circuit 114 is a current mirror circuit including the resistances R5 and R10 and the NPN transistors Q5 and Q10, and discharges the capacitor C1 more rapidly than the voltage generation circuit 110.

Now, the operation of the central value detection circuit having the aforementioned configuration will be described.

First, the charging part of the central value detection circuit is operated as follows:

As is shown in FIG. 12, a current flowing through the resistance R8 of the positive threshold value detection circuit 111 is the collector current of the first NPN transistor Q2. Owing to this collector current, a voltage in proportion to a positive difference between the potential of the input signal supplied to the input terminal IN and the potential of the output terminal OUT is applied to the base of the NPN transistor Q8.

At this point, it is assumed, for example, that the potential of the input signal becomes higher than that in the stable state. As described in Embodiment 9, the high potential increases the current flowing through the second resistance R2, thereby increasing the collector current of the first NPN transistor Q2. As a result, a base voltage applied to the base of the NPN transistor Q8 is decreased due to the voltage decrease of the resistance R8. Therefore, in the case where the base voltage of the NPN transistor Q8 becomes lower than a threshold value (which is another parameter related to the positive threshold value), the collector current of the NPN transistor Q1 is increased, and hence, the collector current of the PNP transistor Q9 of the charge circuit 112 is increased. Accordingly, as the characteristic of a current mirror circuit, the collector current of the PNP transistor Q6 of the charge circuit 112 is increased at the same timing as the increase of the collector current of the PNP transistor Q9. Thus, the capacitor C1 can be rapidly charged.

Next, the discharging part of the central value detection circuit is operated as follows:

A current flowing through the resistance R7 of the negative threshold value detection circuit 113 is the collector current of the first PNP transistor Q1. Owing to this collector current, a voltage in proportion to a negative difference between the potential of the input signal supplied to the input terminal IN and the potential of the output terminal OUT is applied to the base of the PNP transistor Q7.

At this point, it is assumed, for example, that the potential of the input signal becomes lower than that in the stable state. The low potential increases the current flowing through the first resistance R1, thereby increasing the collector current of the first PNP transistor Q1. As a result, a base voltage applied to the base of the PNP transistor Q7 is increased. Therefore, in the case where the base voltage of the PNP transistor Q7 exceeds a threshold value, the collector current of the PNP transistor Q12 is increased, thereby increasing the collector current of the NPN transistor Q10 of the discharge circuit 114. Accordingly, as the characteristic of a current mirror circuit, the collector current of the NPN transistor Q5 of the discharge circuit 114 is increased at the same timing as the increase of the collector current of the NPN transistor Q10. Thus, the capacitor C1 can be rapidly discharged.

Furthermore, in this embodiment, the positive threshold value and the negative threshold value can be independently set, so as to be the same or respectively different in the charging part and the discharging part, depending upon the characteristic of the input signal. Therefore, the AC component of the input signal can be definitely smoothed.

(Embodiment 11)

Embodiment 11 of this invention will now be described referring to the accompanying drawings.

Figure 13:
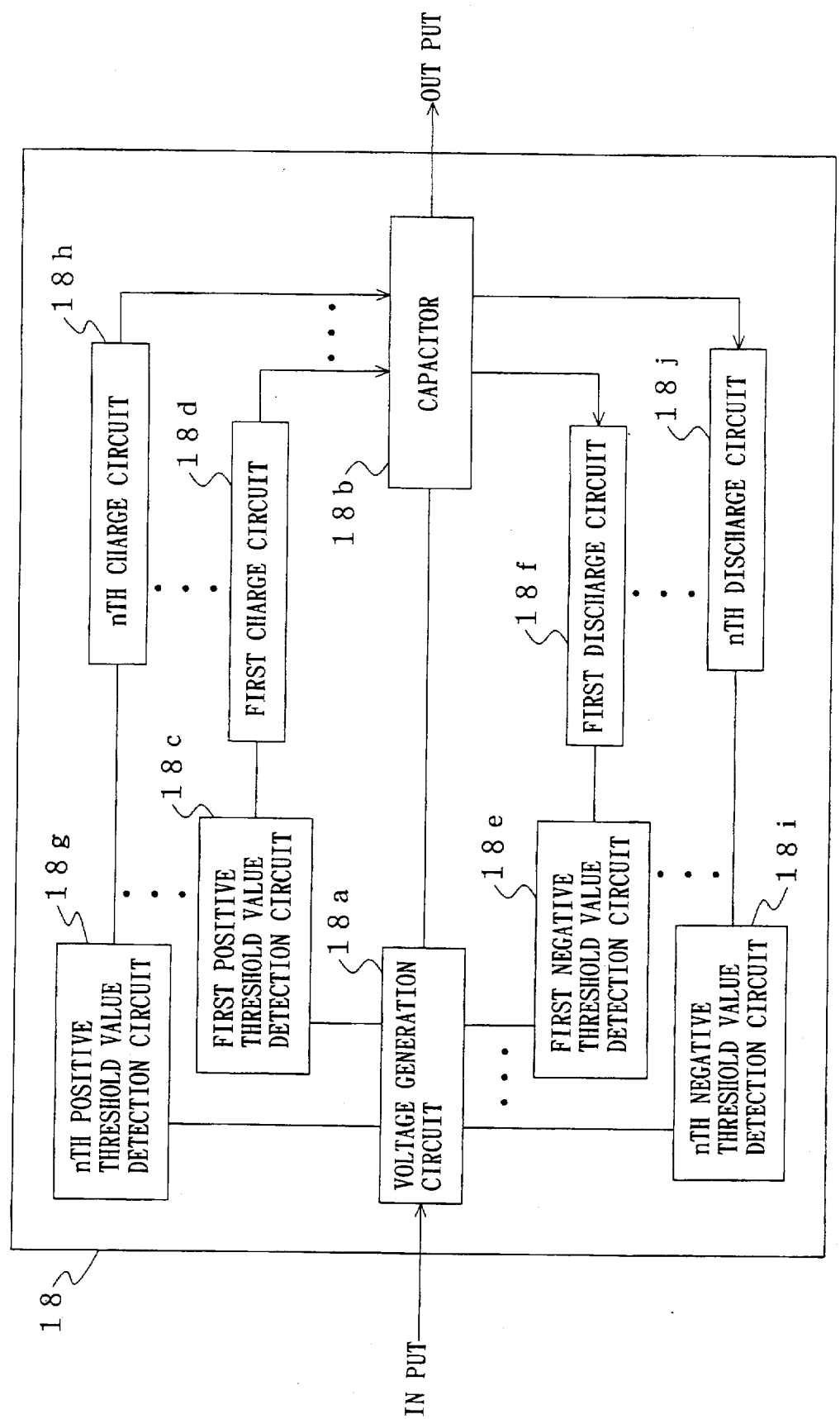
FIG. 13 is a diagram for showing the configuration of a central value detection circuit according to an eleventh embodiment.

FIG. 13 is a diagram for showing the configuration of a central value detection circuit used in a reproducing signal amplifier of this embodiment. In FIG. 13, composing elements newly added to the configuration of Embodiment 10 shown in FIG. 11 alone will be described. A reference numeral 18g denotes an nth positive threshold value detection circuit connected in parallel with a first positive threshold value detection circuit 18c, and a reference numeral 18h denotes an nth charge circuit interposed between the nth positive threshold value detection circuit 18g and the capacitor 18b. Also, a reference numeral 18i denotes an nth negative threshold value detection circuit connected in parallel with a first negative threshold value detection circuit 18e, and a reference numeral 18j denotes an nth discharge circuit interposed between the nth negative threshold value detection circuit 18i and the capacitor 18b.

It is noted that the value n is a positive integer equal to or larger than two, and that the value n is not necessarily the same in the charging part and the discharging part but can be appropriately set in accordance with the characteristic of the input signal.

Figure 14:
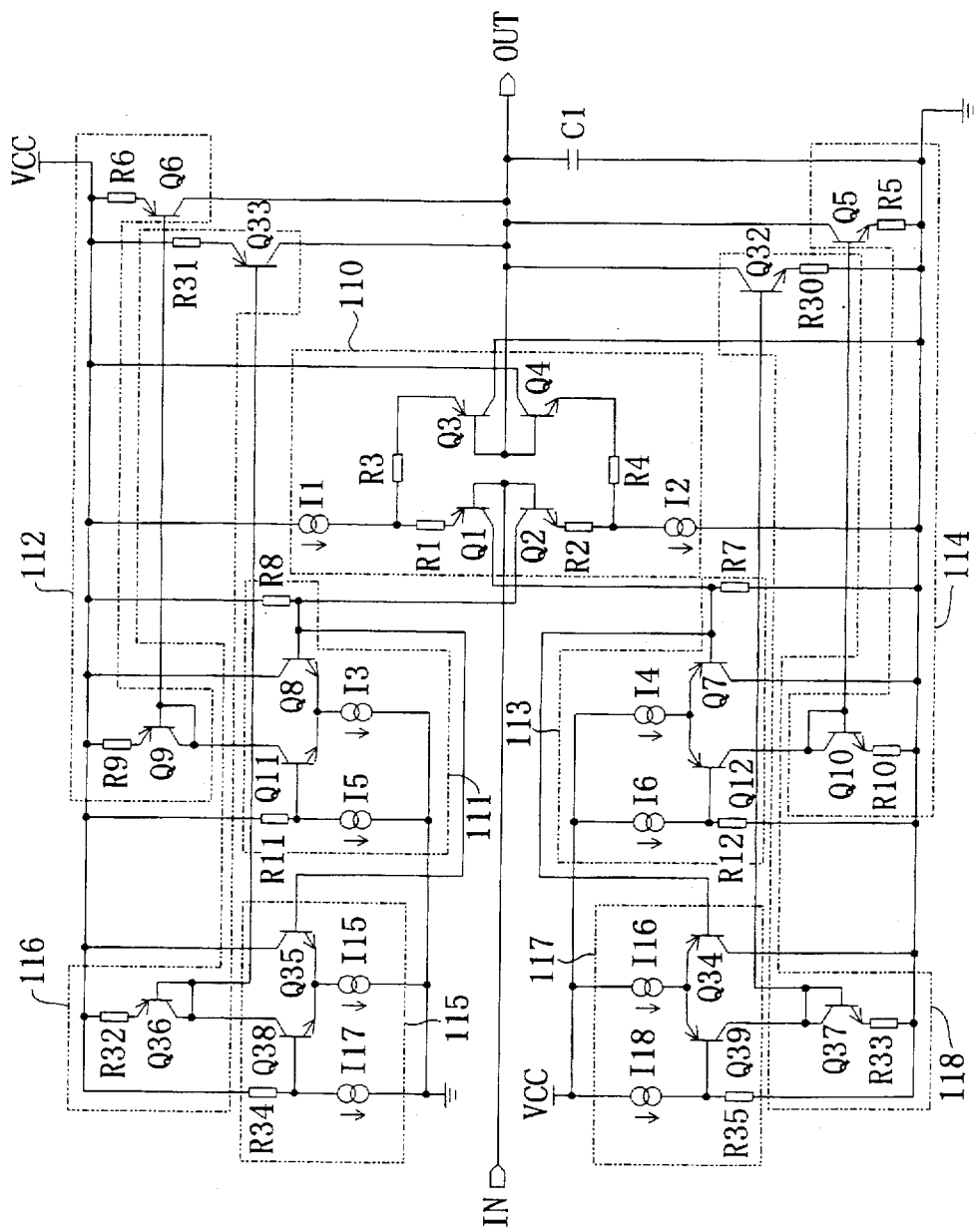
FIG. 14 is a circuit diagram of the central value detection circuit of the eleventh embodiment.

FIG. 14 is a circuit diagram of the central value detection circuit of this embodiment. FIG. 14 shows an example of the central value detection circuit where the values n for the positive and negative threshold values are both set at two. In FIG. 14, composing elements newly added to the configuration of Embodiment 10 shown in FIG. 12 alone, specifically, a second positive threshold value detection circuit 115, a second charge circuit 116, a second negative threshold value detection circuit 117 and a second discharge circuit 118, will be described.

With regard to added composing elements, Q33, Q34, Q36 and Q39 indicate PNP transistors, Q32, Q35, Q37 and Q38 indicate NPN transistors, I15 through I18 indicate current sources and R30 through R35 indicate resistances.

The second positive threshold value detection circuit 115 includes the resistance R34 and the current source I17 together serving as means for setting a second positive threshold value, which is larger than the first threshold value, in the voltage corresponding to the amplitude in the positive direction of the AC component of the input signal, and further includes the NPN transistors Q35 and Q38 and the current source I15 for detecting the second positive threshold value.

The second charge circuit 116 is a current mirror circuit including the resistances R31 and R32 and the PNP transistors Q33 and Q36, and charges the capacitor C1 more rapidly than the voltage generation circuit 110.

The second negative threshold value detection circuit 117 includes the resistance R35 and the current source I18 together serving as means for setting a second negative threshold value in the voltage corresponding to the amplitude in the negative direction of the AC component of the input signal, and further includes the PNP transistors Q34 and Q39 and the current source I16 for detecting the second negative threshold value.

The second discharge circuit 118 is a current mirror circuit including the resistances R30 and R33 and the NPN transistors Q32 and Q37, and discharges the capacitor C1 more rapidly than the voltage generation circuit 110.

Now, the operation of the central value detection circuit having the aforementioned configuration will be described.

The first positive threshold value detection circuit, the first charge circuit, the first negative threshold value detection circuit and the first discharge circuit are identical to the positive threshold value detection circuit, the charge circuit, the negative threshold value detection circuit and the discharge circuit of Embodiment 10, respectively.

The charging part of the central value detection circuit is operated as follows:

First, as is shown in FIG. 14, the first positive threshold value is previously set on the basis of the current values of the resistance R11 and the current source I15 of the first positive threshold value detection circuit, and similarly the second positive threshold value is previously set on the basis of the current values of the resistance R34 and the current source I17 of the second positive threshold value detection circuit 115.

A current flowing through the resistance R8 of the first positive threshold value detection circuit 111 is the collector current of the first NPN transistor Q2. Owing to this collector current, a voltage in proportion to a positive difference between the potential of the input signal supplied to the input terminal IN and the potential of the output terminal OUT is applied to the bases of the NPN transistor Q8 and the NPN transistor Q35.

At this point, it is assumed, for example, that the potential of the input signal becomes higher than that in the stable state. The high potential increases the current flowing through the second resistance R2, thereby increasing the collector current of the first NPN transistor Q2. As a result, a base voltage applied to the base of the NPN transistor Q8 is decreased due to the voltage decrease of the resistance R8. Therefore, in the case where the base voltage of the NPN transistor Q8 exceeds the first positive threshold value but does not exceed the second positive threshold value, the first charge circuit 112 charges the capacitor C1 more rapidly than the voltage generation circuit 110 as described in Embodiment 10.

Furthermore, in the case where the potential of the input signal is further increased so as to exceed the second positive threshold value, the collector current of the NPN transistor Q38 of the second positive threshold value detection circuit 115 is increased, thereby increasing the collector current of the PNP transistor Q36 of the second charge circuit 116. Accordingly, as the characteristic of a current mirror circuit, the collector current of the PNP transistor Q33 of the second charge circuit 116 is increased at the same timing as the increase of the collector current of the PNP transistor Q36, so as to make contribution to the charge of the capacitor C1 together with the collector current of the PNP transistor Q6 of the first charge circuit 112. Thus, the capacitor C1 is more rapidly charged.

Furthermore, as described in Embodiment 10, the operations of the first and second negative threshold value detection circuits 113 and 117 and the first and second discharge circuits 114 and 118 in the discharging part can be understood by inverting the polarities of the transistors in the corresponding first and second positive threshold value detection circuits 111 and 115 and first and second charge circuits 112 and 116, and hence, the description is omitted.

In this manner, in this embodiment, the first and second positive threshold values can be independently set as well as the first and second negative threshold values can be independently set. Therefore, the threshold values in the charging part and the discharging part can be set at the same value or respectively different values depending upon the characteristic of a noise applied to the input signal. As a result, even when the input signal is abruptly changed, a central value signal can be rapidly and accurately detected and generated.

(Embodiment 12)

Embodiment 12 of the invention will now be described referring to the accompanying drawings.

Figure 15:
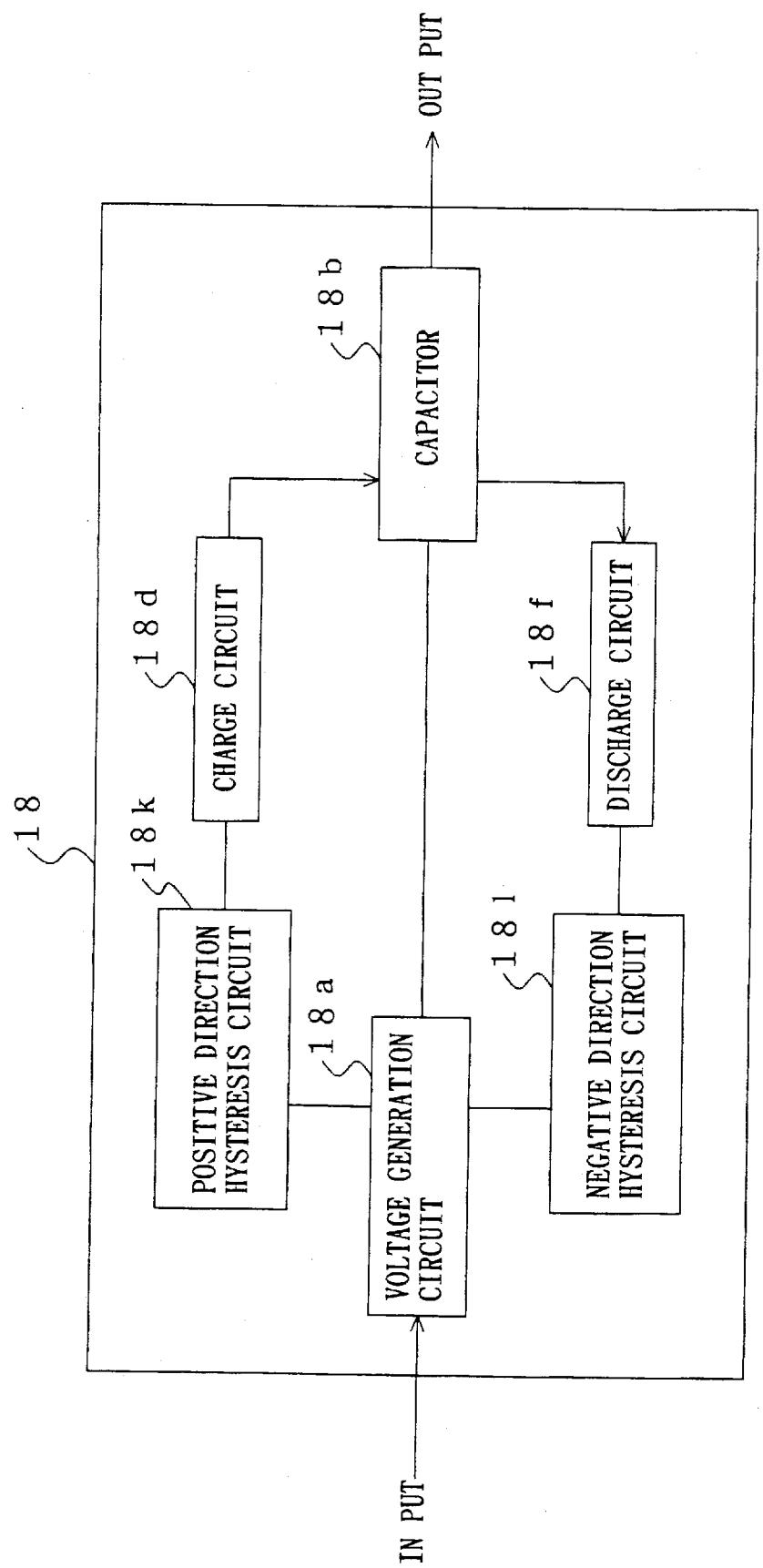
FIG. 15 is a diagram for showing the configuration of a central value detection circuit according to a twelfth embodiment.

FIG. 15 is a diagram for showing the configuration of a central value detection circuit used in a reproducing signal amplifier of this embodiment. In FIG. 15, a difference from the composing elements of Embodiment 10 shown in FIG. 11 alone will be described. A reference numeral 18k denotes a positive direction hysteresis circuit serving as a positive hysteresis characteristic generation circuit obtained by allowing the positive threshold value of the positive threshold value detection circuit to have a hysteresis characteristic, and a reference numeral 18l denotes a negative direction hysteresis circuit serving as a negative hysteresis characteristic generation circuit obtained by allowing the negative threshold value of the negative threshold value detection circuit to have a hysteresis characteristic.

Figure 16:
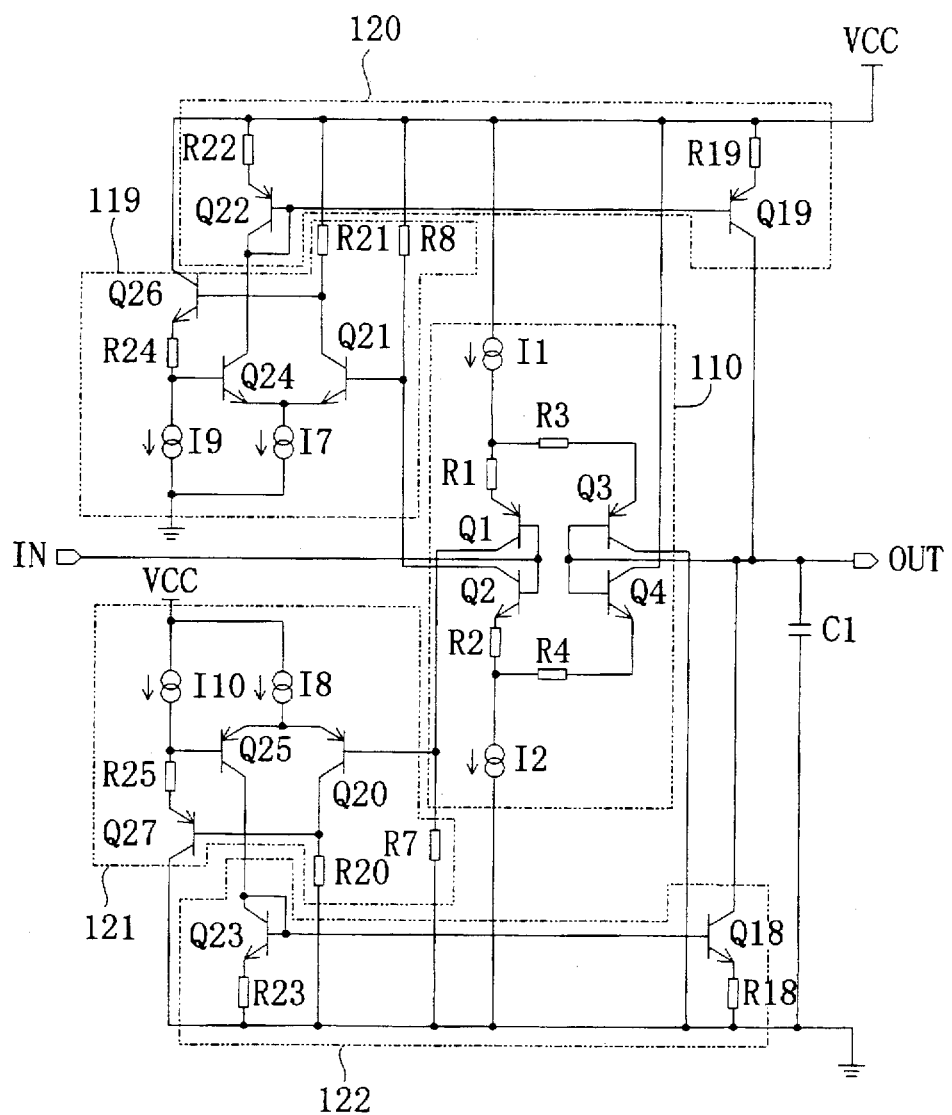
FIG. 16 is a circuit diagram of the central value detection circuit of the twelfth embodiment.

FIG. 16 is a circuit diagram of the central value detection circuit of this embodiment. In FIG. 16, composing elements different from those of Embodiment 10 shown in FIG. 12 alone, specifically, a positive direction hysteresis circuit 119 and a negative direction hysteresis circuit 121, will be described.

With regard to newly added composing elements, Q19, Q20, Q22, Q25 and Q27 indicate PNP transistors, Q18, Q21, Q23, Q24 and Q26 indicate NPN transistors, I7 through I10 indicate current sources and R18 through R25 indicate resistances.

The positive direction hysteresis circuit 119 includes the resistance R21, the current source I7, the NPN transistor Q26, the resistance R24 and the current source I9 together serving as means for setting a first positive threshold value in a voltage corresponding to the amplitude in the positive direction of the AC component of the input signal; the NPN transistor Q26, the resistance R24 and the current source I9 together serving as means for setting a second positive threshold value for allowing the first positive threshold value to have the hysteresis characteristic; and the NPN transistors Q21 and Q24 and the current source I7 for detecting the first and second positive threshold values.

The charge circuit 120 is a current mirror circuit including the resistances R19 and R22 and the PNP transistors Q19 and Q22, and can charge the capacitor C1 more rapidly than the voltage generation circuit 110.

The negative direction hysteresis circuit 121 includes the resistance R20, the current source I8, the PNP transistor Q27, the resistance R25 and the current source I10 together serving as means for setting a first negative threshold value in a voltage corresponding to the amplitude in the negative direction of the AC component of the input signal; the PNP transistor Q27, the resistance R25 and the current source I10 together serving as means for setting a second negative threshold value for allowing the first negative threshold value to have the hysteresis characteristic; and the PNP transistors Q20 and Q25 and the current source I8 for detecting the first and second negative threshold values.

The discharge circuit 122 is a current mirror circuit including the resistances R18 and R23 and the NPN transistors Q18 and Q23, and can discharge the capacitor C1 more rapidly than the voltage generation circuit 110.

Now, the operation of the central value detection circuit having the aforementioned configuration will be described.

The charging part of the central value detection circuit is operated as follows:

First, as is shown in FIG. 16, the first positive threshold value is previously set on the basis of the current values of the resistance R21, the current source I7, the base emitter voltage $V_{BE}$ of the NPN transistor Q26, the resistance R24 and the current source I9 of the positive direction hysteresis circuit 119. The second positive threshold value for providing the first positive threshold value with the hysteresis characteristic is previously set on the basis of the current values of the base emitter voltage $V_{BE}$ of the NPN transistor Q26, the resistance R24 and the current source I9.

A current flowing through the resistance R8 of the positive direction hysteresis circuit 119 is the collector current of the first NPN transistor Q2. Owing to this collector current, a voltage in proportion to a positive difference between the potential of the input signal supplied to the input terminal IN and the potential of the output terminal OUT is applied to the base of the NPN transistor Q21.

At this point, it is assumed, for example, that the potential of the input signal becomes higher than that in the stable state. The high potential increases the current flowing through the second resistance R2, thereby increasing the collector current of the first NPN transistor Q2. As a result, a base voltage applied to the base of the NPN transistor Q21 is decreased owing to the voltage decrease of the resistance R8. Therefore, in the case where the base voltage of the NPN transistor Q21 exceeds the first positive threshold voltage, the PNP transistor Q19 of the charge circuit 120 rapidly charges the capacitor C1 as described in Embodiment 10.

At the same time, since the collector current of the NPN transistor Q21 is decreased, the base voltage of the NPN transistor Q26 connected with the collector of the NPN transistor Q21 is increased, thereby increasing the current value of the current flowing through the resistance R24. The increase of the current value of the resistance R24 provides the first positive threshold value with the hysteresis characteristic. As a result, the potential becomes lower than the first positive threshold value. Accordingly, the charge circuit 120 continues to be operated until the potential of the input signal returns to the second positive threshold value.

Since the first positive threshold value for activating the charge circuit 120 is provided with the hysteresis characteristic in this manner, even when the input signal is varied around the first positive threshold value, the chattering phenomenon is not caused in the charge circuit 120. Accordingly, it is possible not only to detect the central value signal of the input signal rapidly and accurately but also to stabilize the operation of the central value detection circuit.

The operations of the negative direction hysteresis circuit 121 and the discharge circuit 122 in the discharging part can be understood by inverting the polarities of the transistors of the positive direction hysteresis circuit 119 and the charge circuit 120 in the charging part, and hence, the description is omitted.

(Embodiment 13)

Embodiment 13 of this invention will now be described referring to the accompanying drawings.

Figure 17:
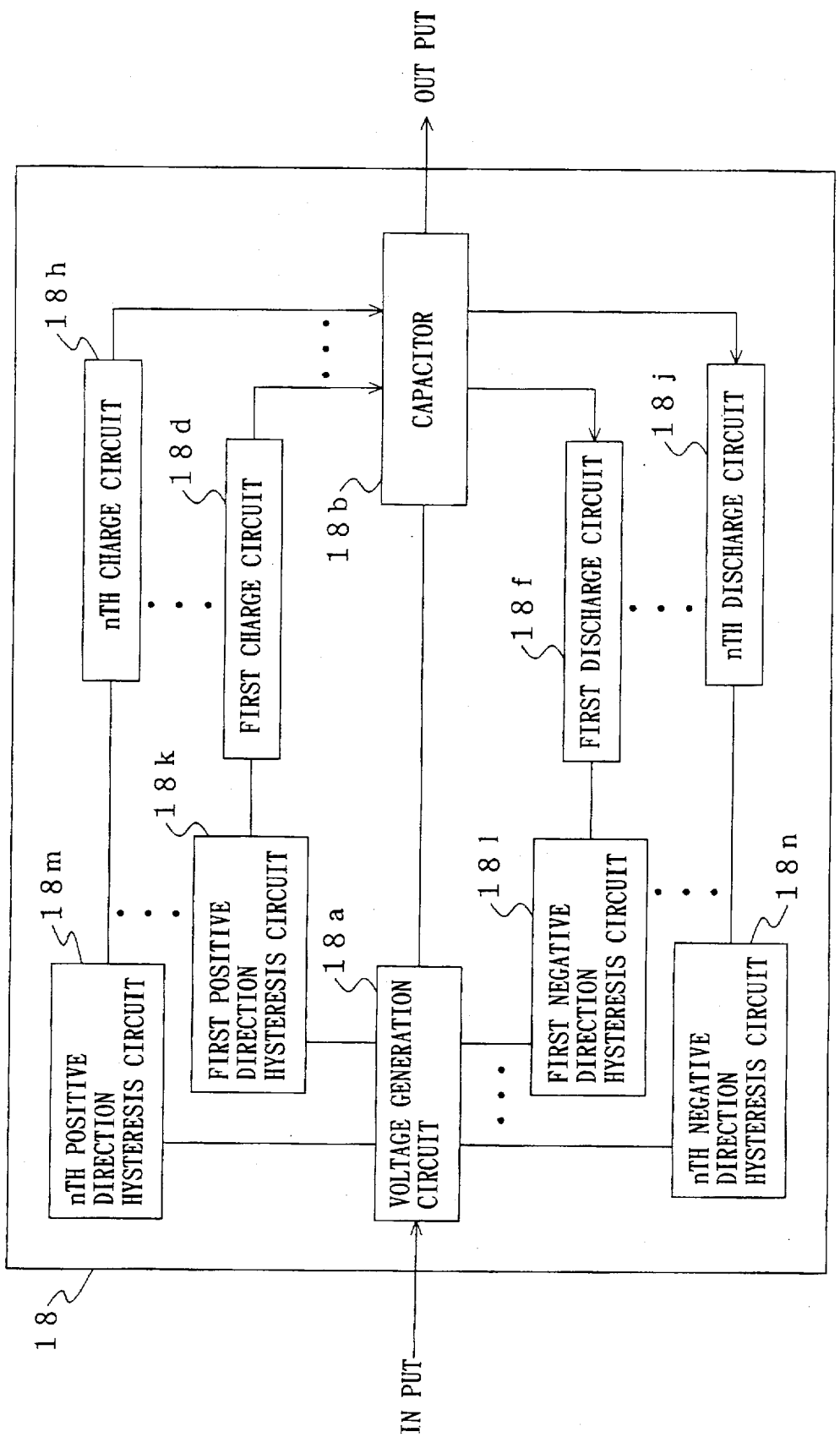
FIG. 17 is a diagram for showing the configuration of a central value detection circuit according to a thirteenth embodiment.

FIG. 17 is a diagram for showing the configuration of a central value detection circuit used in a reproducing signal amplifier of this embodiment. In FIG. 17, composing elements newly added to the configuration of Embodiment 12 shown in FIG. 15 alone will be described. A reference numeral 18m denotes an nth positive direction hysteresis circuit connected in parallel with a first positive direction hysteresis circuit 18k, and a reference numeral 18h denotes an nth charge circuit interposed between the nth positive direction hysteresis circuit 18m and the capacitor 18b. Also, a reference numeral 18n denotes an nth negative direction hysteresis circuit connected in parallel with a first negative direction hysteresis circuit 18l, and a reference numeral 18j denotes an nth discharge circuit interposed between the nth negative direction hysteresis circuit 18n and the capacitor 18b.

It is noted that the value n indicates a number of the threshold values set in each of the charging part and the discharging part of the central value detection circuit, and is a positive integer equal to or larger than two in this embodiment. The value n is not necessarily the same in the charging part and the discharging part but can be appropriately set in accordance with the characteristic of the input signal.

Figure 18:
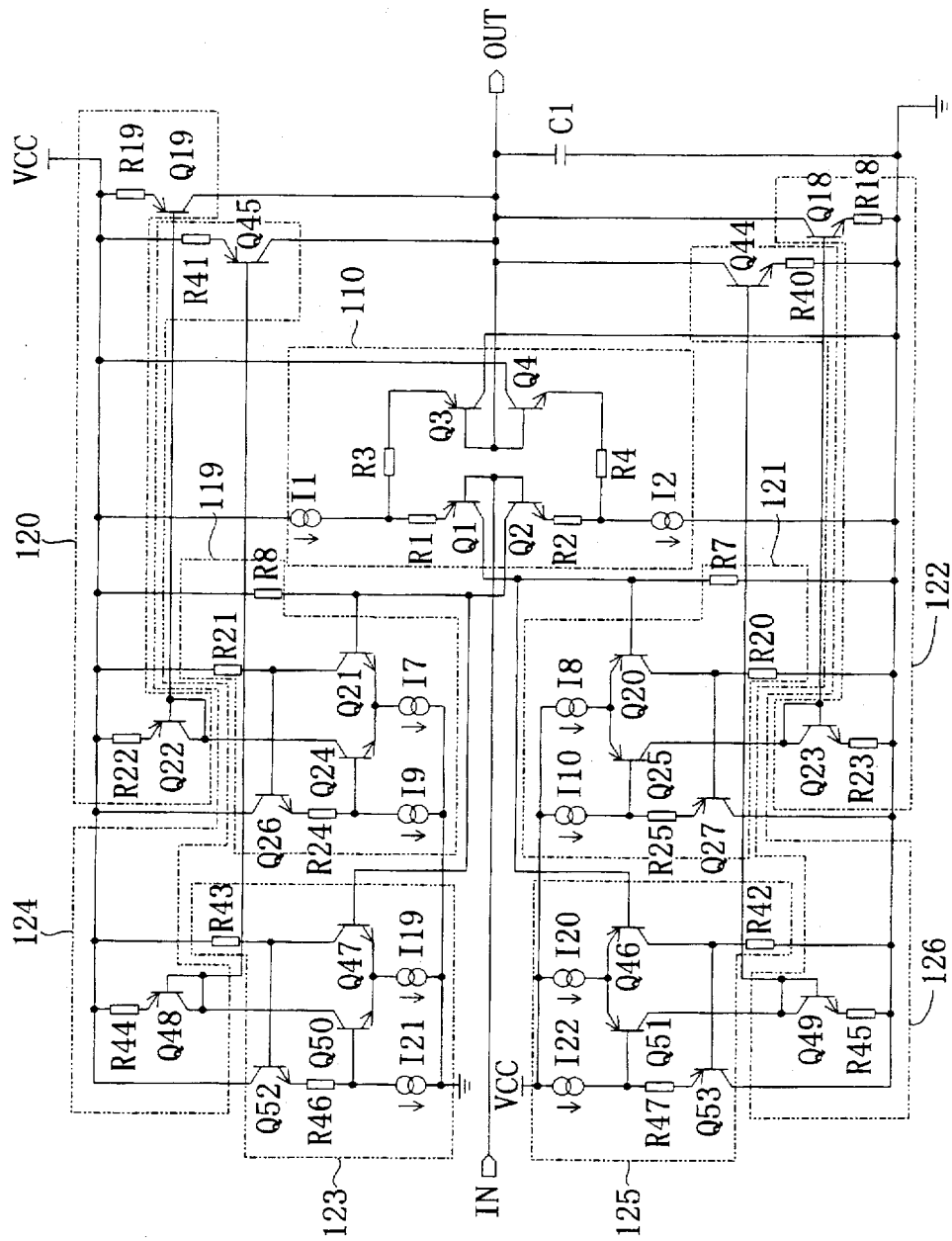
FIG. 18 is a circuit diagram of the central value detection circuit of the thirteenth embodiment.
Figure 19:
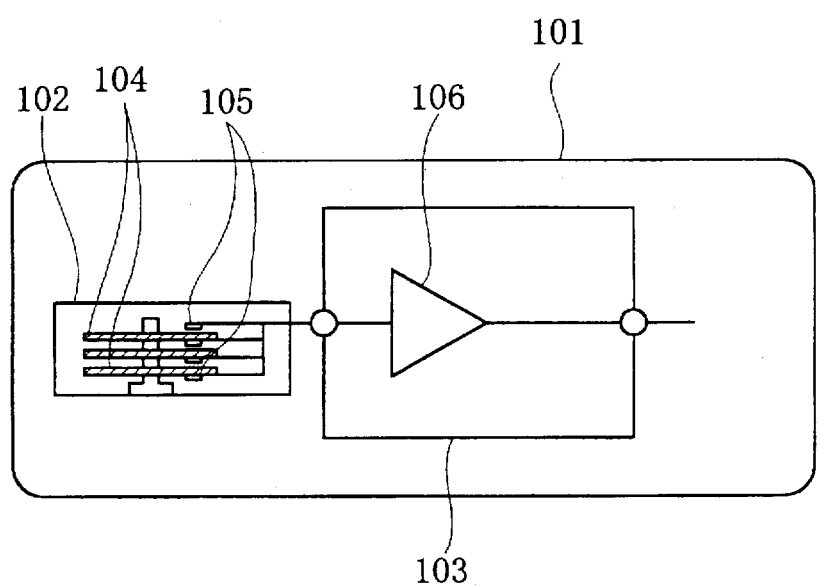
FIG. 19 is a diagram for showing the configuration of a reproducing signal amplifier in a conventional magnetic recording device.

FIG. 18 is a circuit diagram of the central value detection circuit of this embodiment. FIG. 18 shows an example of the central value detection circuit where the values n for the positive and negative threshold values are both set at two, and the positive and negative threshold values are respectively provided with the hysteresis characteristics. In FIG. 18, composing elements newly added to the configuration of Embodiment 12 shown in FIG. 16 alone, specifically, a second positive direction hysteresis circuit 123, a second charge circuit 124, a second negative direction hysteresis circuit 125 and a second discharge circuit 126, will be described.

With regard to added composing elements, Q45, Q46, Q48, Q51 and Q53 indicate PNP transistors, Q44, Q47, Q49, Q50 and Q52 indicate NPN transistors, I19 through I22 indicate current sources and R40 through R47 indicate resistances.

The second positive direction hysteresis circuit 123 includes the resistance R43, the current source I9, the NPN transistor Q52, the resistance R46 and the current source I21 together serving as means for setting a first positive threshold value in a voltage corresponding to the amplitude in the positive direction of the AC component of the input signal; the NPN transistor Q52, the resistance R46 and the current source I21 together serving as means for setting a second positive threshold value for allowing the first positive threshold value to have the hysteresis characteristic; and the NPN transistors Q47 and Q50 and the current source I19 for detecting the first and second positive threshold values.

The second charge circuit 124 is a current mirror circuit including the resistances R41 and R44 and the PNP transistors Q45 and Q48, and can charge the capacitor C1 more rapidly than the voltage generation circuit 110.

The negative direction hysteresis circuit 125 includes the resistance R42, the current source I20, the PNP transistor Q53, the resistance R47 and the current source I22 together serving as means for setting a first negative threshold value in a voltage corresponding to the amplitude in the negative direction of the AC component of the input signal; the PNP transistor Q53, the resistance R47 and the current source I22 together serving as means for setting a second negative threshold value for allowing the first negative threshold value to have the hysteresis characteristic; and the PNP transistors Q46 and Q51 and the current source I20 for detecting the first and second negative threshold values.

The second discharge circuit 126 is a current mirror circuit including the resistances R40 and R45 and the NPN transistors Q44 and Q49, and can discharge the capacitor C1 more rapidly than the voltage generation circuit 110.

Now, the operation of the central value detection circuit having the aforementioned configuration will be described.

The charging part of the central value detection circuit is operated as follows:

Description will be made with regard to the second positive direction hysteresis circuit 123 alone. First, as is shown in FIG. 18, the first positive threshold value is previously set on the basis of the current values of the resistance R43, the current source I19, the base emitter voltage $V_{BE}$ of the NPN transistor Q52, the resistance R46 and the current source I21 of the second positive direction hysteresis circuit 123. Similarly, the second positive threshold value for allowing the first positive threshold value to have the hysteresis characteristic is previously set on the basis of the current values of the base emitter voltage $V_{BE}$ of the NPN transistor Q52, the resistance R46 and the current source I21.

A current flowing through the resistance R8 of the first positive direction hysteresis circuit 119 is the collector current of the first NPN transistor Q2. Owing to this collector current, a voltage in proportion to a positive difference between the potential of the input signal supplied to the input terminal IN and the potential of the output terminal OUT is applied to the base of the NPN transistor Q47.

At this point, it is assumed, for example, that the potential of the input signal becomes higher than that in the stable state. The high potential increases the current flowing through the second resistance R2, thereby increasing the collector current of the first NPN transistor Q2. As a result, a base voltage applied to the base of the NPN transistor Q47 is decreased due to the voltage decrease of the resistance R8. Therefore, in the case where the base voltage of the NPN transistor Q47 exceeds the first positive threshold value, the PNP transistor Q45 of the second charge circuit 124 charges the capacitor C1 more rapidly than the voltage generation circuit 110.

At the same time, since the collector current of the NPN transistor Q47 is decreased, the base voltage of the NPN transistor Q52 connected with the collector of the NPN transistor Q47 is increased, resulting in increasing the current value of the current flowing through the resistance R46. The increase of the current value of the resistance R46 provides the first positive threshold value with the hysteresis characteristic. As a result, the potential becomes lower than the first positive threshold value. Accordingly, the second charge circuit 124 continues to be operated until the potential of the input signal returns to the second positive threshold value.

Since the first positive threshold value for activating the second charge circuit 124 is provided with the hysteresis characteristic in this manner, even when the input signal is varied around the first positive threshold value, the chattering phenomenon is never caused in the second charge circuit 124. As a result, not only the central value signal of the input signal can be detected rapidly and accurately but also the operation of the central value detection circuit can be stabilized.

The operations of the second negative direction hysteresis circuit 125 and the second discharge circuit 126 in the discharging part can be understood by inverting the polarities of the transistors of the second positive direction hysteresis circuit 123 and the second charge circuit 124 in the charging part, and hence, the description is omitted.

For example, the first positive threshold value of the second positive direction hysteresis circuit 123 is set at a larger value than the first positive threshold value of the first positive direction hysteresis circuit 119, and the second positive threshold value of the second positive direction hysteresis circuit 123 is set at a larger value than the second positive threshold value of the first positive direction hysteresis circuit 119. In such a case, as a characteristic of this embodiment, the capacitor can be charged or discharged at a more appropriate current in accordance with the voltage of the AC component of the input signal. Accordingly, even when the input signal is abruptly and largely varied, the central value of the input signal can be detected and generated rapidly and accurately.

What is claimed is:

1. A reproducing signal amplifier for a magnetic recording device comprising:
   an amplifier for amplifying an input signal and outputting an amplified signal;
   a central value signal generator for receiving said amplified signal, and generating and outputting a central value signal corresponding to a central value of said amplified signal by smoothing an AC component of said amplified signal; and
   a subtracter for receiving said amplified signal and said central value signal and outputting a reproducing signal obtained as a difference between said amplified signal and said central value signal.

2. The reproducing signal amplifier of claim 1 further comprising a delay circuit for receiving said amplified signal and delaying a phase of said amplified signal so as to be supplied to said subtracter.

3. The reproducing signal amplifier of claim 1 further comprising on/off control means for instructing start/halt of an operation of said central value signal generator.

4. The reproducing signal amplifier of claim 1 further comprising gain control means for increasing/decreasing a gain of said amplifier.

5. The reproducing signal amplifier of claim 1 further comprising a peak value detection circuit for receiving said amplified signal, detecting a peak value of an amplitude of said amplified signal and outputting said peak value to said central value signal generator.

6. The reproducing signal amplifier of claim 5 further comprising a storage circuit for storing said peak value detected by said peak value detection circuit.

7. The reproducing signal amplifier of claim 6 further comprising peak value control means for referring/changing said peak value stored in said storage circuit.

8. The reproducing signal amplifier of claim 1,
   wherein said central value signal generator includes:
      a voltage generation circuit for generating and outputting a voltage substantially equal to a potential of said amplified signal; and
      a capacitor which is charged/discharged by the voltage output by said voltage generation circuit so as to smooth the AC component of said amplified signal.

9. The reproducing signal amplifier of claim 8,
   wherein said central value signal generator further includes:
      a threshold value detection circuit for detecting a threshold value set in said amplified signal input to said central value signal generator and outputting a threshold value exceeding signal component which exceeds said threshold value set in said amplified signal; and
      a charge/discharge circuit for charging/discharging said capacitor in accordance with the threshold value exceeding signal component.

10. The reproducing signal amplifier of claim 9,
   wherein said threshold value is provided with a hysteresis characteristic by a hysteresis characteristic generation circuit.

11. The reproducing signal amplifier of claim 8,
   wherein said central value signal generator further includes:
      a positive threshold value detection circuit for detecting a positive threshold value set in a positive signal component of said amplified signal input to said central value signal generator and outputting a positive threshold value exceeding signal component which exceeds said positive threshold value set in the positive signal component;
      a negative threshold value detection circuit for detecting a negative threshold value set in a negative signal component of said amplified signal and outputting a negative threshold value exceeding signal component which exceeds, in its absolute value, said negative threshold value set in said negative signal component;
      a charge circuit for charging said capacitor in accordance with the positive threshold value exceeding signal component; and
      a discharge circuit for discharging said capacitor in accordance with the negative threshold value exceeding signal component,
   wherein said positive threshold value and said negative threshold value are independently set.

12. The reproducing signal amplifier of claim 11,
   wherein said positive threshold value detection circuit is plural in number,
   said plural positive threshold value detection circuits have respectively different positive threshold values, and
   said charge circuit is plural in number so as to respectively correspond to said plural positive threshold value detection circuits.

13. The reproducing signal amplifier of claim 11,
   wherein said negative threshold value detection circuit is plural in number,
   said plural negative threshold value detection circuits have respectively different negative threshold values, and
   said discharge circuit is plural in number so as to respectively correspond to said plural negative threshold value detection circuits.

14. The reproducing signal amplifier of claim 11,
   wherein said positive threshold value is provided with a hysteresis characteristic by a positive hysteresis generation circuit, and
   said negative threshold value is provided with a hysteresis characteristic by a negative hysteresis generation circuit.

15. A reproducing signal amplifier for a magnetic recording device comprising:

an amplifier for amplifying an input signal and outputting an amplified signal;

a central value signal generator for receiving said amplified signal, and generating and outputting a central value signal corresponding to a central value of said amplified signal by smoothing an AC component of said amplified signal;

an amplified signal output terminal for outputting said amplified signal output by said amplifier; and a central value signal output terminal for outputting said central value signal output by said central value signal generator.

16. The reproducing signal amplifier of claim 15 further comprising a delay circuit for receiving said amplified signal and delaying a phase of said amplified signal so as to be supplied to the amplified signal output terminal.

* * * * *